(12) United States Patent
Akiyama et al.

(10) Patent No.: US 7,224,629 B2
(45) Date of Patent: May 29, 2007

(54) MEMORY DEVICE HAVING HIGH SPEED SENSE AMPLIFIER COMPRISING PULL-UP CIRCUIT AND PULL-DOWN CIRCUITS WITH DIFFERENT DRIVABILITY FOR EACH

(75) Inventors: Satoru Akiyama, Kawasaki (JP); Riichiro Takemura, Tokyo (JP); Takayuki Kawahara, Higashiyamato (JP); Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 62 days.

(21) Appl. No.: 11/071,351

(22) Filed: Mar. 4, 2005

(65) Prior Publication Data

US 2005/0232044 A1 Oct. 20, 2005

(30) Foreign Application Priority Data

Apr. 2, 2004 (JP) ............................. 2004-109598

(51) Int. Cl.
*G11C 7/02* (2006.01)
(52) U.S. Cl. ..................................... 365/208; 365/207
(58) Field of Classification Search .......... 365/189.11, 365/190, 205, 207 X, 208 O
See application file for complete search history.

(56) References Cited

U.S. PATENT DOCUMENTS

| 5,029,137 A | 7/1991 | Hoshi | 365/208 |
| 6,043,562 A * | 3/2000 | Keeth | 257/776 |
| 6,222,275 B1 * | 4/2001 | Keeth | 257/776 |
| 6,243,311 B1 * | 6/2001 | Keeth | 365/206 |
| 6,392,303 B2 * | 5/2002 | Keeth | 257/776 |
| 6,504,255 B2 * | 1/2003 | Keeth | 257/776 |
| 6,594,173 B2 * | 7/2003 | Keeth | 365/63 |
| 2004/0136253 A1 * | 7/2004 | Gupta et al. | 365/205 |

FOREIGN PATENT DOCUMENTS

| JP | 2-14677 | 6/1990 |
| JP | 07-226081 | 8/1995 |
| JP | 2002-261254 | 9/2002 |

OTHER PUBLICATIONS

Itoh, *VLSI Memory Chip Design*, Springer, 2001, pp. 195-247.
Hong et al., "An Offset Cancellation Bit-line Sensing Scheme for Low-Voltage DRAM Applications," ISSCC2002 Dig. Tech. Papers, Session 9, Dram and Ferroelectric Memories 9.2, Feb. 5, 2002, pp. 453-455.
Sims et al., "Charge-Transferred Presensing and Efficiently Precharged Negative Word-Line Schemes for Low-Voltage DRAMs," 2003 Symposium on VLSI Circuits Dig. Tech. Papers, 2003, pp. 289-292.

* cited by examiner

*Primary Examiner*—VanThu Nguyen
(74) *Attorney, Agent, or Firm*—Miles & Stockbridge P.C

(57) ABSTRACT

A sense amplifier is constructed to reduce the occurrence of malfunctions in a memory read operation, and thus degraded chip yield, due to increased offset of the sense amplifier with further sealing down. The sense amplifier circuit is constructed with a plurality of pull-down circuits and a pull-up circuit, and a transistor in one of the plurality of pull-down circuits has a constant such as a channel length or a channel width larger than that of a transistor in another pulldown circuit. The pull-down circuit with a larger constant of a transistor is first activated, and then, the other pull-down circuit and the pull-up circuit are activated to perform the read operation.

15 Claims, 22 Drawing Sheets

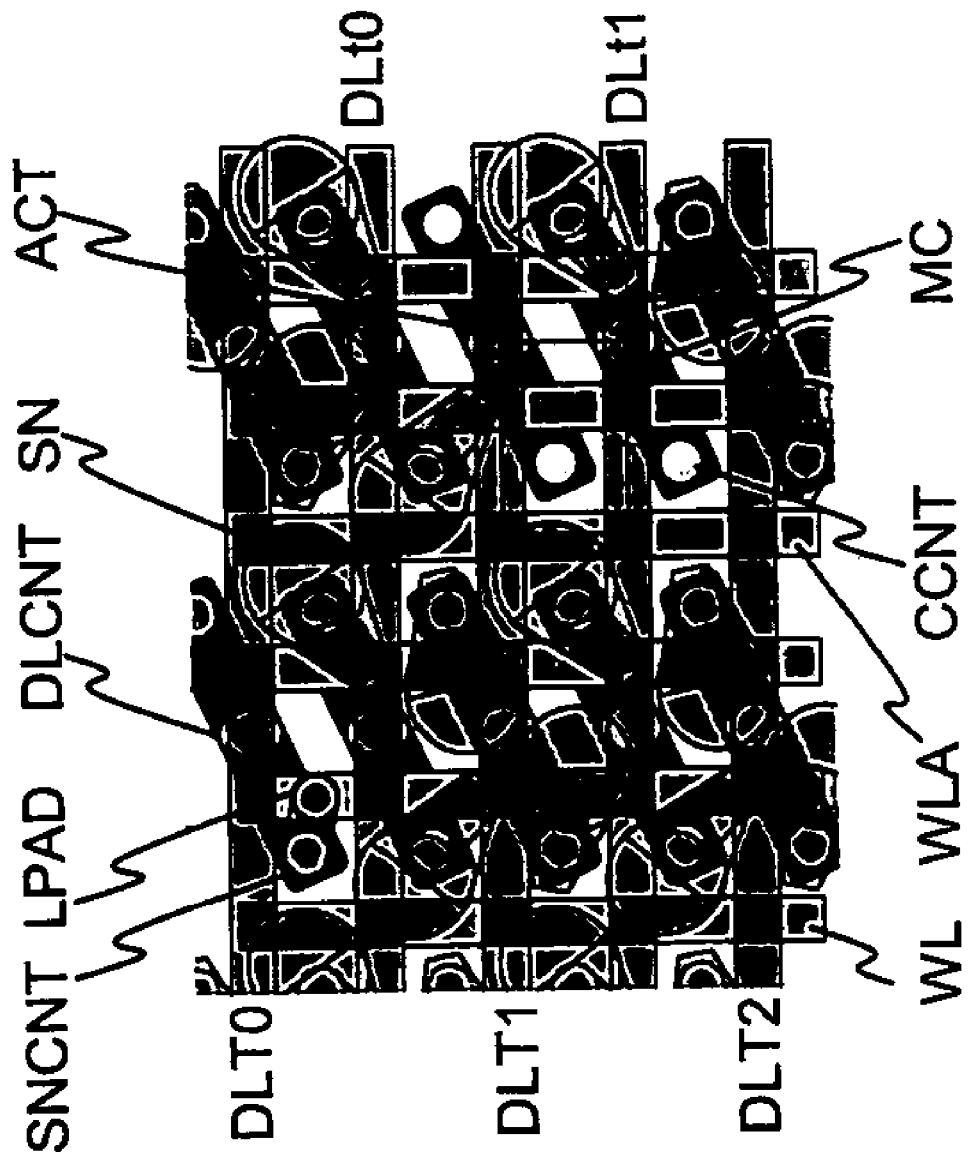

MEMORY DEVICE HAVING HIGH SPEED SENSE AMPLIFIER COMPRISING PULL-UP CIRCUIT AND PULL-DOWN CIRCUITS WITH DIFFERENT DRIVABILITY FOR EACH

CROSS-REFERENCE TO RELATED APPLICATION

The present application claims priority from Japanese Patent Application JP 2004-109598 filed on Apr. 2, 2004, the content of which is hereby incorporated by reference into this application.

TECHNICAL FIELD OF THE INVENTION

The present invention relates to a semiconductor memory device. More particularly, the present invention relates to a low power consumption, high-speed, and highly integrated semiconductor memory device and to a differential amplification operation of a semiconductor device in which a logic circuit and a semiconductor memory device are integrated.

BACKGROUND OF THE INVENTION

The dynamic random access memory (hereinafter, referred to as DRAM) which is one example of the semiconductor memory device is mounted in various types of electronic equipment used in our daily life, for example, in a main memory of a large-scale computer and a personal computer and a work memory of digital electronics such as a cellular phone and a digital camera. In addition, with the increasing needs for the lower power consumption and higher performance in the equipment in recent years, the high-performance DRAM capable of achieving the low power consumption, the high-speed operation, and the large capacity has been strongly demanded.

The most effective method to realize the high-performance DRAM is to scale down the cell transistors and the cell capacitors used in a memory cell of the DRAM. The scaling down of the cell transistors and the cell capacitors makes it possible to reduce the size of the memory cell. As a result, the length of the gate line is reduced and the parasitic capacitance of the data line can be reduced. Consequently, the low voltage operation is enabled and the low power consumption can be achieved. Also, since the parasitic capacitance of the data line can be reduced, the sense amplifier can be operated at high speed. Furthermore, the merit obtained from the scaling down is significant, for example, the improvement of the performance of the equipment resulting from the increase of the capacity of the memory. Therefore, the performance of not only the existing products but also the products under development can be improved by the scaling down.

However, due to the further scaling down in the 0.1 um node or the 0.065 um node and 0.045 um node like in the existing product, various side effects occur in addition to the above-described effects of the performance improvement. The side effect includes the malfunction caused when reading a signal of the memory cell due to the variation in device characteristics which is increased by the scaling down. In this case, the variation in device characteristics means, for example, the difference in intensity of the threshold voltage of the cell transistor and the leakage current from the cell transistor (deviation from the average value). As described above, if the variation in device characteristics is large, various problems occur. For example, the data retention characteristics of the DRAM are degraded, and the yield of the chip is reduced. In particular, it is concerned that the variation in threshold voltage of the sense amplifier circuit increases in the future. This is because the data line pitch of the memory cell is very narrow in the recent DRAM and thus the size of the sense amplifier circuit connected to the data line must be reduced in the layout. Therefore, the processing error of the transistors constituting the sense amplifier becomes large, and as a result, the variation in threshold voltage of the pair transistor is increased. Usually, this problem is called the offset of the sense amplifier, and causes a large influence on the performance of the DRAM. In addition, the problem of the offset of the sense amplifier is described in detail in "VLSI Memory Chip Design", pp. 195 to 247, Springer, 2001 by Kiyoo Itoh, and it is well known that the reduction of the offset greatly contributes to the improvement of the yield of the DRAM. Therefore, for the achievement of the performance improvement by the scaling down, the circuit design which can achieve not only the reduction of the processing error but also the reduction of the sense amplifier offset is required as an important technology in the future.

As an example for the solution of the above-described problems, ISSCC2002 Dig. Tech. Papers, pp. 154 to 155 by Sang Hoon Hong et al. discloses the technology for canceling the sense amplifier offset. In this method, the precharge voltage of the data line is corrected by using a current mirror operational amplifier. By doing so, the offset of the sense amplifier can be substantially reduced. However, since the number of devices added to the sense amplifier is vary large and the area of the sense amplifier is increased in this method, the chip size is increased. In addition, since the control signals to be driven are also increased, the timing margin is increased, and thus, the reduction of the operation speed is concerned. Also, "2003 symposium on VLSI Circuits Dig. Tech. Papers, pp. 289 to 292" by Jae-Yoon Simm et al. discloses a charge-transfer type sense amplifier. In this method, the charge accumulated in a peripheral circuit such as a sense amplifier is transferred to a data line on the memory cell side via a switch transistor connected to the data line so as to generate large potential difference in the sense amplifier. Therefore, even when the offset of the sense amplifier is increased, since the potential difference larger than the offset can be applied to the sense amplifier, it stands up well to the variation and is superior in the low-voltage operation. However, also in this method, since a number of additional devices, for example, a precharge circuit and a switch transistor for rewriting are required, the chip size is increased.

SUMMARY OF THE INVENTION

Under the circumstance as described above, an object of the present invention is to provide a sense amplifier circuit which can be realized with a small number of additional devices, can be operated at high speed, and can reduce the offset of the sense amplifier.

For the achievement of the above-described object, prior to the present invention, the inventors of the present invention have studied the influence caused by the offset of the sense amplifier on the read operation and the configuration of the sense amplifier capable of reducing the offset and realized with a minimum number of additional devices.

FIG. 18 is a diagram showing the circuit configuration of a representative DRAM. In FIG. 18, the memory cell MC is comprised of an access transistor TN0 whose drain is connected to a data line DLB and a cell capacitor CS0 one electrode of which is connected to a source of the access transistor TN0. Note that the potential of L is retained in the memory cell MC. A data line pair DLT and DLB connected to a plurality of memory cells is connected to a sense amplifier circuit SA0 via a switch transistor SHR. The sense amplifier circuit SA0 is comprised of a column switch YSW, a precharge circuit PCH, a pull-down circuit NDRV, and a pull-up circuit PDRV. FIG. 19 shows a timing waveform when reading the signal of the memory cell MC by using the conventional sense amplifier circuit SA0 of FIG. 18, which shows the occurrence of the malfunction. First, the data line is precharged by driving the precharge circuit PCH, and the precharge circuit PCH is negated. Then, the switch transistor SHRL on the selection sub-array SARY side is driven high and kept in this state, and the other switch transistor SHRR is negated low. When the sub-word line WL0 is asserted, the minute signal corresponding to L is outputted form the memory cell MC to the data line DLB, and the signal difference dVsig occurs in the data line pair.

Thereafter, when a common source line CSN of the pull-down circuit NDRV and a common source line CSP of the pull-up circuit PDRV are driven to a ground voltage VSS and a data line voltage BDL, respectively, the minute potential difference dVsig represented by a broken line is amplified to a high level VDL and a low level VSS and is transferred to the circuits of latter stages through the column switch YSW and the local data lines LIOT and LIOB. However, as described above, the further scaling down increases the offset of the sense amplifier. For example, in FIG. 18, the difference VTN1–VTN2 between the threshold voltage VTN1 of the NMOS transistor TN1 and the threshold voltage VTN2 of the NMOS transistor TN2 in the pull-down circuit NDRV becomes larger than the minute signal difference dVsig, and at the same time, the difference VTP1–VTP2 between the threshold voltage VTP1 of the PMOS transistor TP1 and the threshold voltage VTP2 of the PMOS transistor TP2 in the pull-up circuit PDRV becomes larger than the minute signal difference dVsig in some cases. In such a case, since the data line DLT is driven to the L side more strongly than the data line DLB, the reading malfunction occurs as represented by the solid line in FIG. 19.

For the prevention of the malfunction as described above, the method in which the constant of transistors constituting the pull-down circuit NDRV and the pull-up circuit PDRV is increased to reduce the offset and the method in which a preamplifier function for amplifying the minute signal difference dVsig to the voltage difference at least larger than the offset is added are available. More concretely, in the former method, the channel length and the channel width of the transistors TN1, TN2, TP1, and TP2 constituting the pull-down circuit NDRV and the pull-up circuit PDRV are simply increased to reduce the offset. In this method, however, the driving current of the sense amplifier circuit SA0 is reduced due to the increase of the channel length and the access speed of the memory is reduced. On the other hand, as the latter method of adding a preamplifier function, one more pull-down circuit NDRV is additionally provided. If the added pull-down circuit is first driven to preamplify the data line to the voltage difference larger than the offset of the original pull-down circuit and the pull-up circuit, the reading malfunction may be prevented.

In addition, the number of added transistors is small, that is, only two transistors are added, and the increase of the area is reduced to the minimum. As a known example of this circuit configuration, Japanese Patent Application Laid-Open No. 7-226081 and Japanese Patent Application Laid-Open No. 2-146177 disclose the sense amplifier circuit using a plurality of pull-down circuits. In the method of this disclosure, the number of added circuits is small and the area overhead is also small. In these methods, however, although the high-speed operation of the sense amplifier is considered, the reduction of the offset to prevent the reading malfunction is not considered at all. More specifically, since the disclosed methods do not have the preamplifier function, the problem of the offset cannot be solved in principle.

Under the circumstance as described above, an object of the present invention is to reduce the sense amplifier offset which will be remarkable in the future and to prevent the reading malfunction. Also, another object of the present invention is to reduce both the offset and the layout area of the sense amplifier circuit SA0.

The typical ones of the inventions disclosed in this application will be briefly described as follows.

In a semiconductor memory device comprised of a plurality of memory cells and a plurality of sense amplifier circuits, the sense amplifier circuit has at least two pull-down circuits. Also, one of the pull-down circuits is first driven to amplify the data line to be larger than the offset of the pull-down circuit and the pull-up circuit in the latter stage, and then, the pull-down circuit and the pull-up circuit in the latter stage are driven. In this case, it is preferable that the channel length and the channel width of the transistors in the pull-down circuit driven first are increased so as to reduce the offset of the transistors. Furthermore, it is also preferable to form the sense amplifier from a plurality of pull-up circuits.

According to the present invention, in the semiconductor integrated circuit including a plurality of memory cells and a plurality of sense amplifier circuits, the offset of the sense amplifier can be reduced. As a result, the low-voltage operation and the high-speed reading operation can be realized. Also, since the offset can be reduced, the length of the data line can be increased and the occupancy of the memory cell can be increased. That is, it is possible to realize the highly integrated semiconductor memory device.

BRIEF DESCRIPTIONS OF THE DRAWINGS

DESCRIPTIONS OF THE PREFERRED EMBODIMENTS

Hereinafter, embodiments of the present invention will be described with reference to the accompanying drawings. Although not particularly limited, the transistor constituting each block in the embodiments is a well-known CMOS (Complementary MOS transistor) formed on a semiconductor substrate made of single crystal silicon by using the known integrated circuit technology. More specifically, the transistor is formed through the process comprising the step of forming a well, a device isolation region, and an oxide film and the step of forming a gate electrode and first and second semiconductor regions to be the source and drain. The circuit symbol of MOSFET (Metal Oxide Semiconductor Field Effect Transistor) not provided with a circular mark on its gate represents an N type MOSFET (NMOS) and is distinguished from a P type MOSFET (PMOS) provided with a circular mark on its gate. Hereinafter, the MOSFET is simply referred to as MOS or MOS transistor. However, the present invention is not limited to the field effect transistor including an oxide film formed between a metal gate and a semiconductor layer and can be applied to a circuit using a standard FET such as MISFET (Metal Insulator Semiconductor Field Effect Transistor) having an insulating film between a metal gate and a semiconductor layer.

Figure 1:
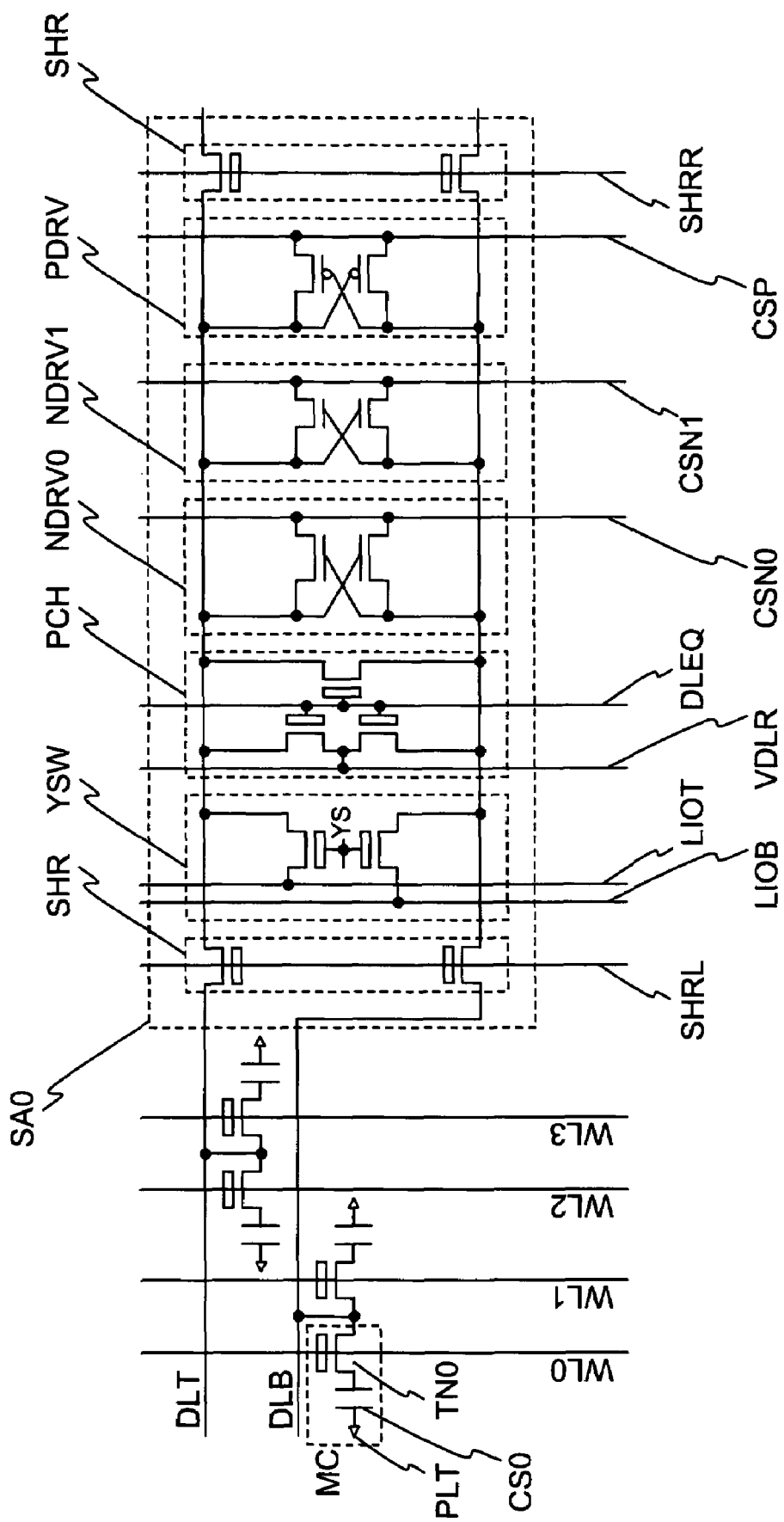
FIG. 1 is a diagram showing the basic configuration of the sense amplifier circuit part of the semiconductor memory device according to the first embodiment of the present invention.
Figure 2:
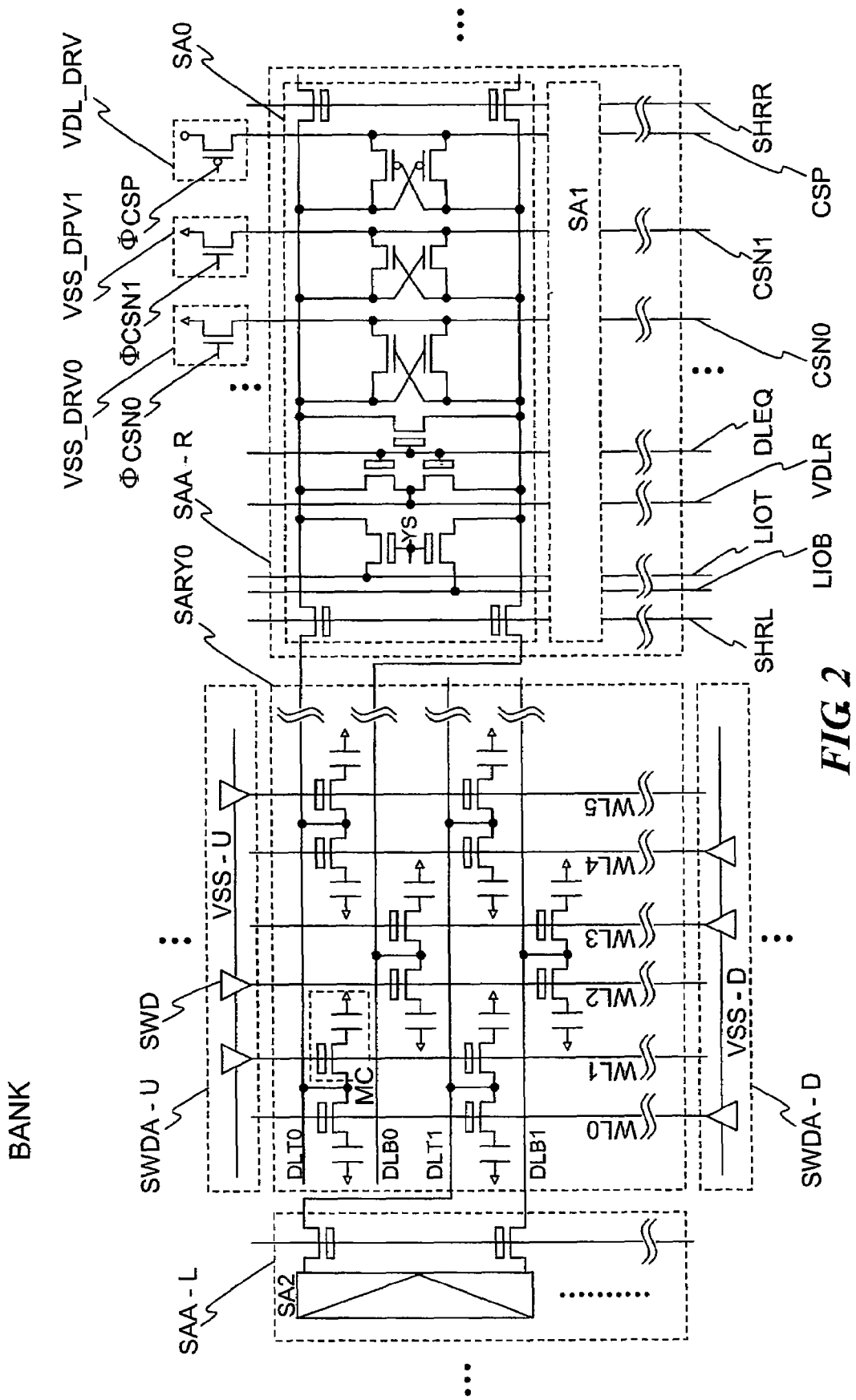
FIG. 2 is a diagram showing an example of the bank comprised of sense amplifier circuits according to the first embodiment shown in FIG. 1.
Figure 3:
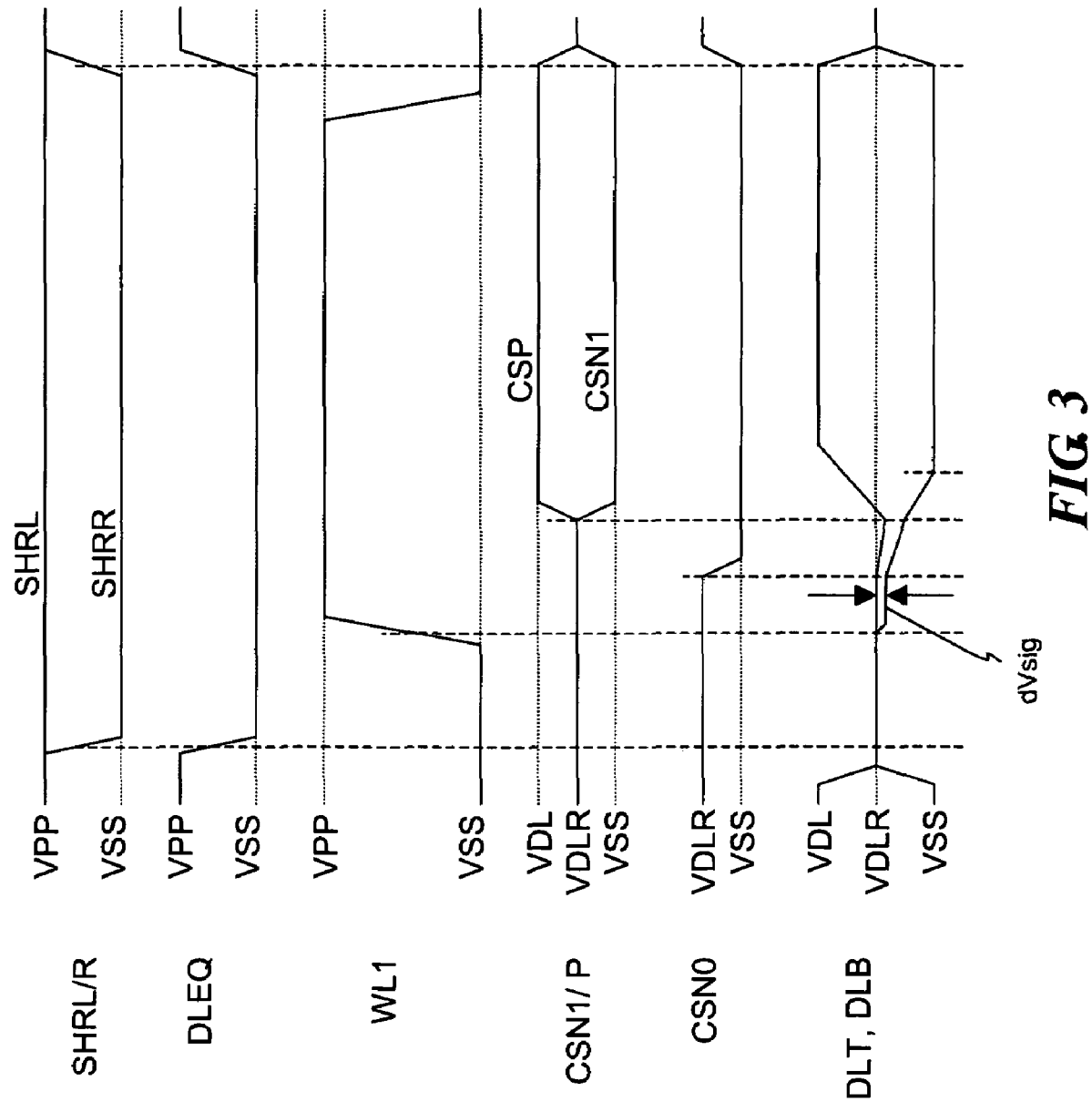
FIG. 3 is a diagram showing an example of the operation waveform of the sense amplifier shown in FIG. 1.
Figure 4:
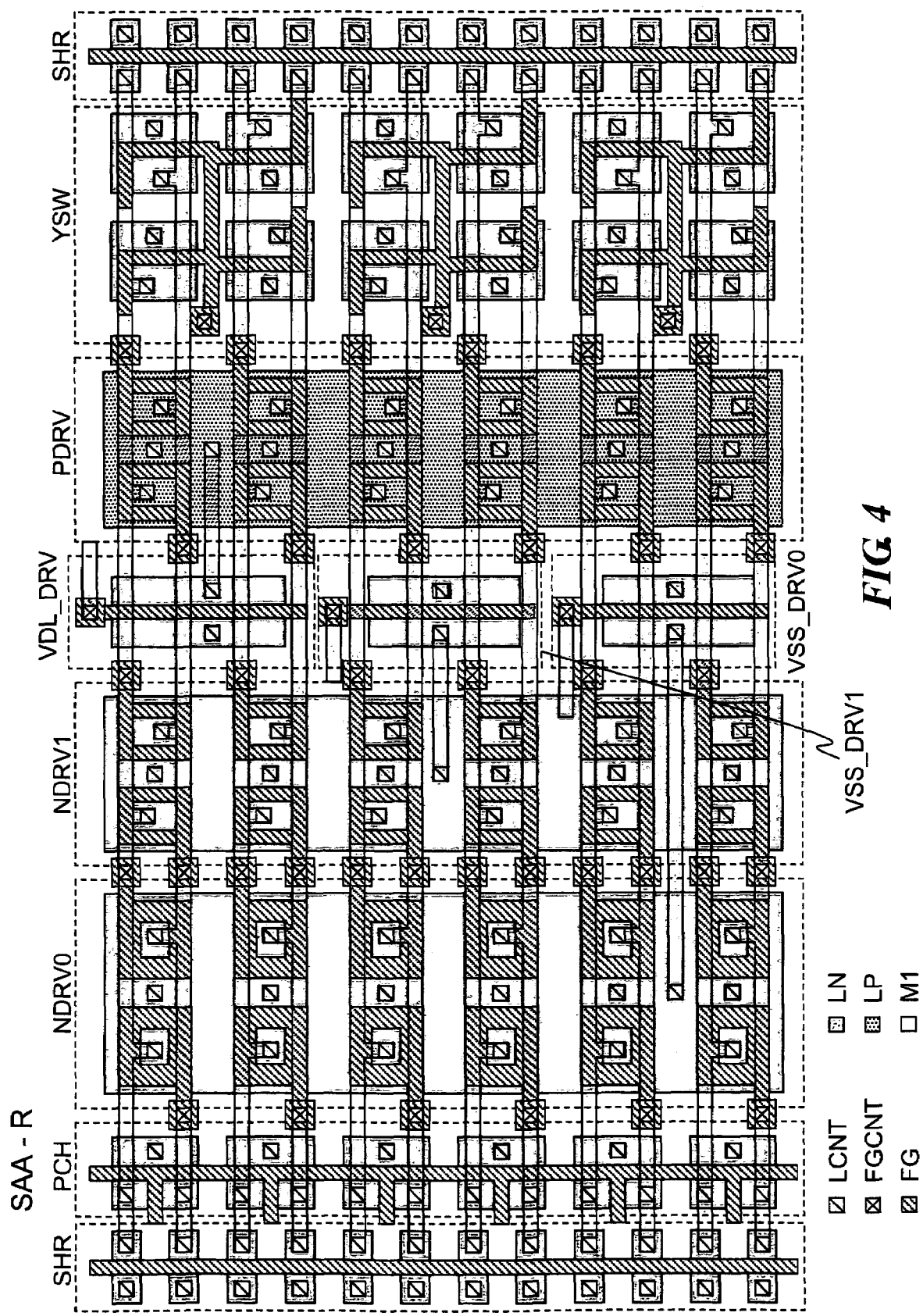
FIG. 4 is a plan view showing an example of the layout of the sense amplifier array shown in FIG. 2.
Figure 5:
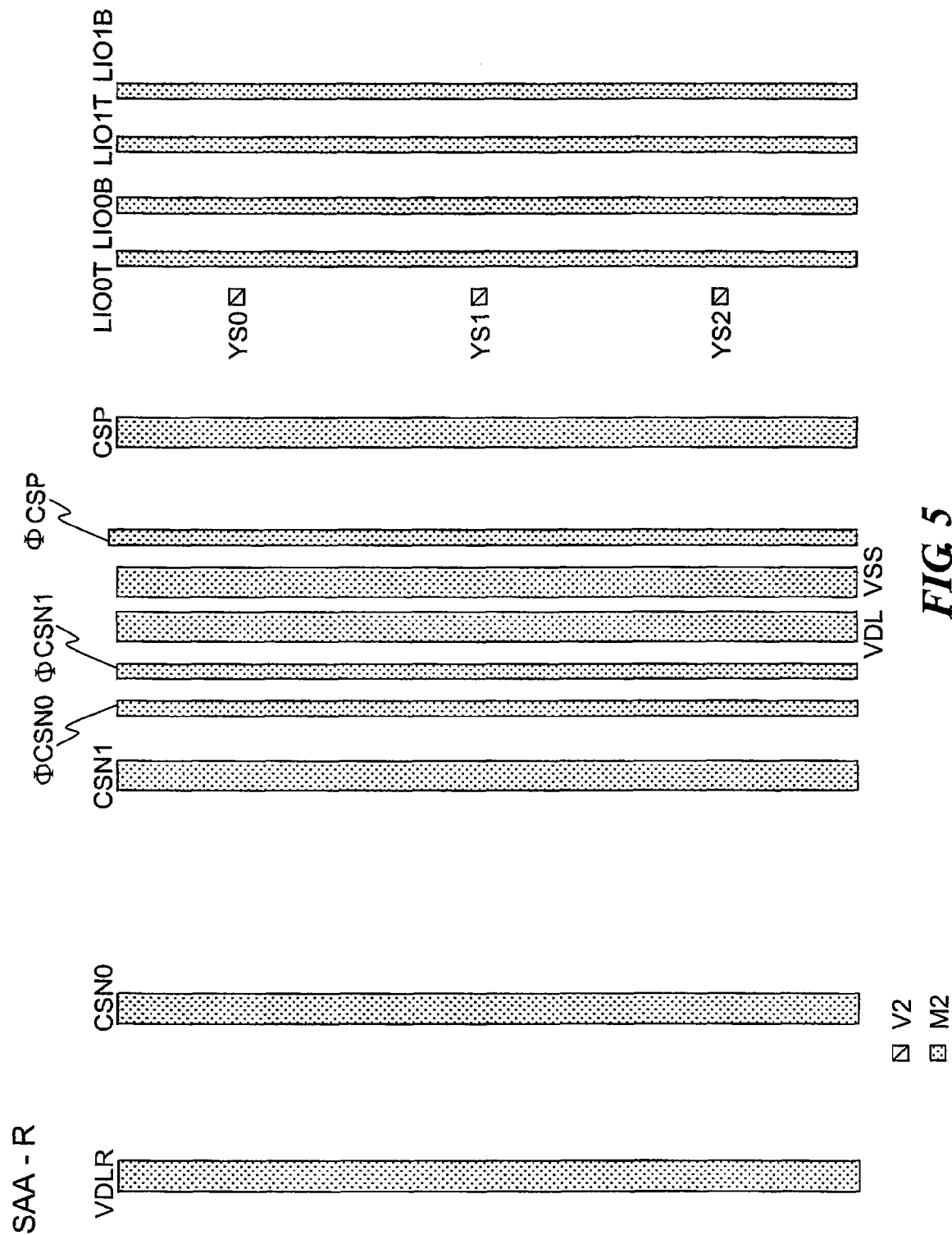
FIG. 5 is a plan view showing an example of the layout of the sense amplifier array shown in FIG. 2.
Figure 7:
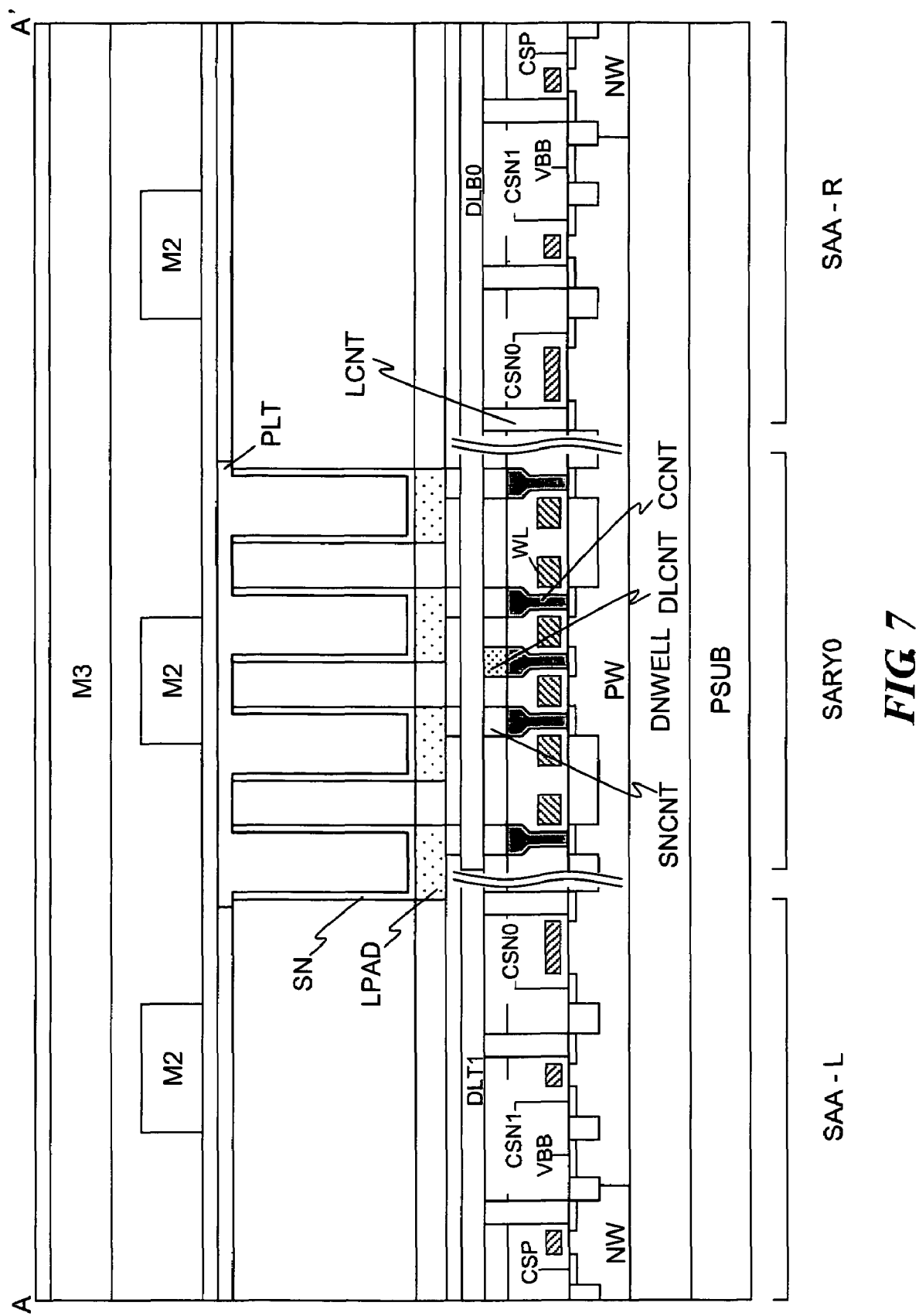
FIG. 7 is a cross-sectional view showing a part of the configuration of the bank shown in FIG. 2.
Figure 8:
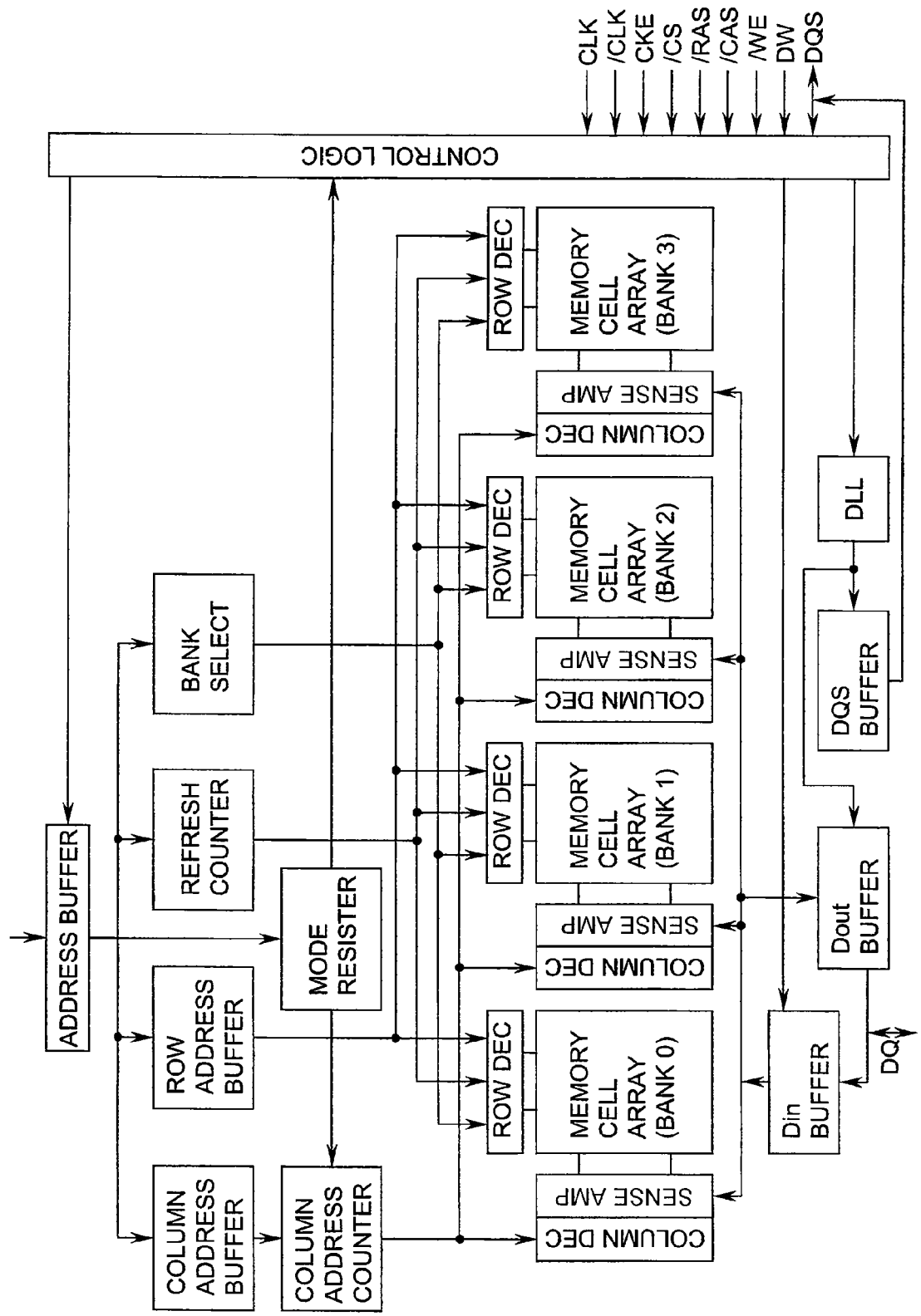
FIG. 8 is a block diagram of a semiconductor memory device comprised of a plurality of sense amplifiers shown in FIG. 1.

FIG. 1 is a diagram showing a sense amplifier circuit SA0 according to the first embodiment of the present invention and a plurality of memory cells MC connected thereto. FIG. 2 is a diagram showing a bank BANK comprised of sense amplifier circuit arrays SAA-R and ASS-L composed of the sense amplifier circuits SA0 according to the first embodiment of the present invention, a sub-array SARY0 composed of a plurality of memory cells MC, and sub-word arrays SWDA-U and SWDA-D composed of a plurality of sub-word drivers SWD. FIG. 3 is a diagram showing a timing waveform of the sense amplifier circuit SA0 in FIG. 1. FIGS. 4 and 5 are layout diagrams of the sense amplifier circuit SA0 shown in FIG. 1. FIGS. 6A to 6D are plan views showing the layout of the plurality of memory cells MC shown in FIG. 1. FIG. 7 is a cross-sectional view showing a part of the plurality of memory cells MC and the sense amplifier circuit SA0 shown in FIG. 6. FIG. 8 is a block diagram of a DRAM comprised of a plurality of banks BANK shown in FIG. 2.

Figure 9:
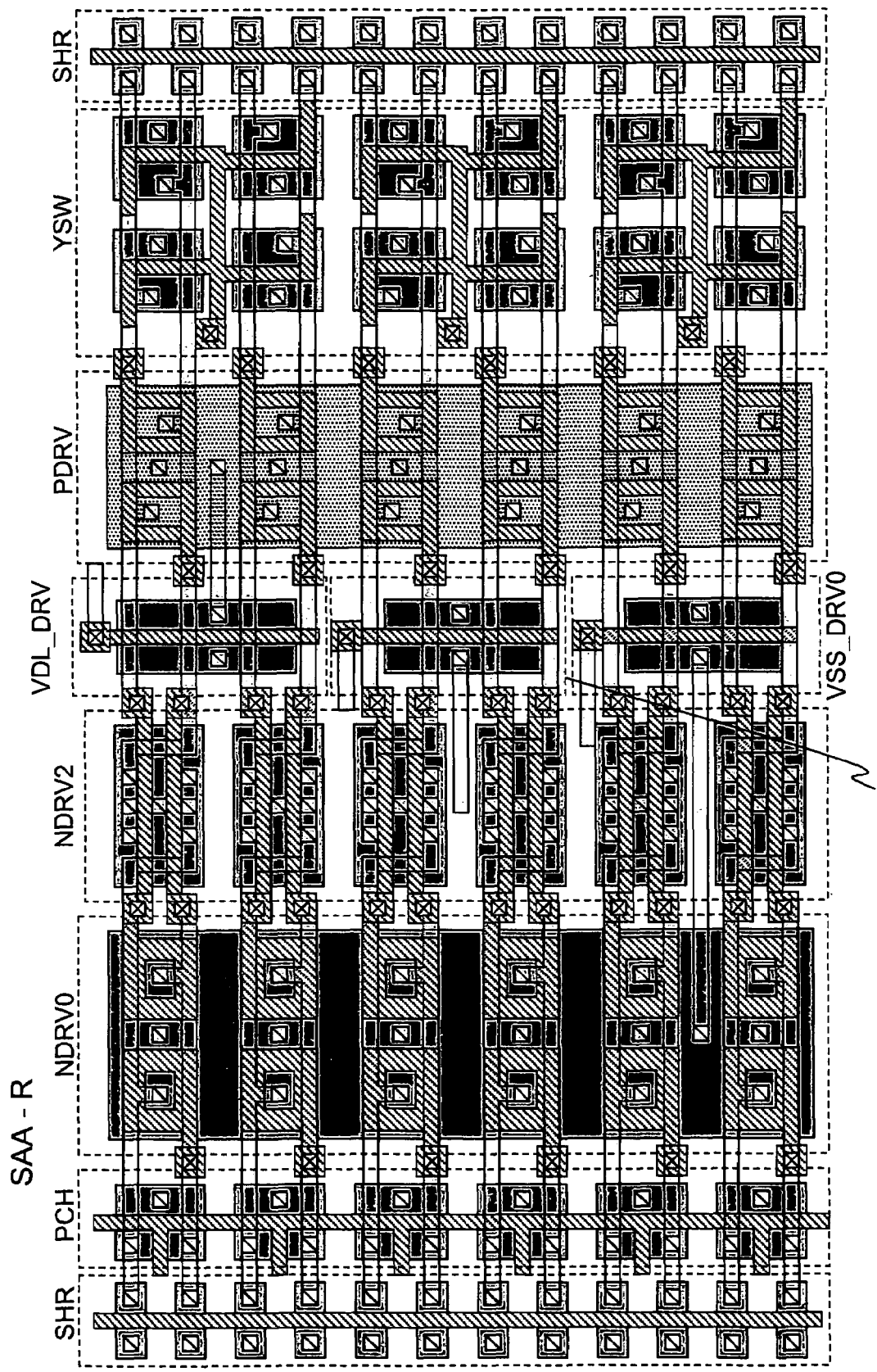
FIG. 9 is a plan view showing a modified example of the layout of the sense amplifier array shown in FIG. 2.
Figure 10:
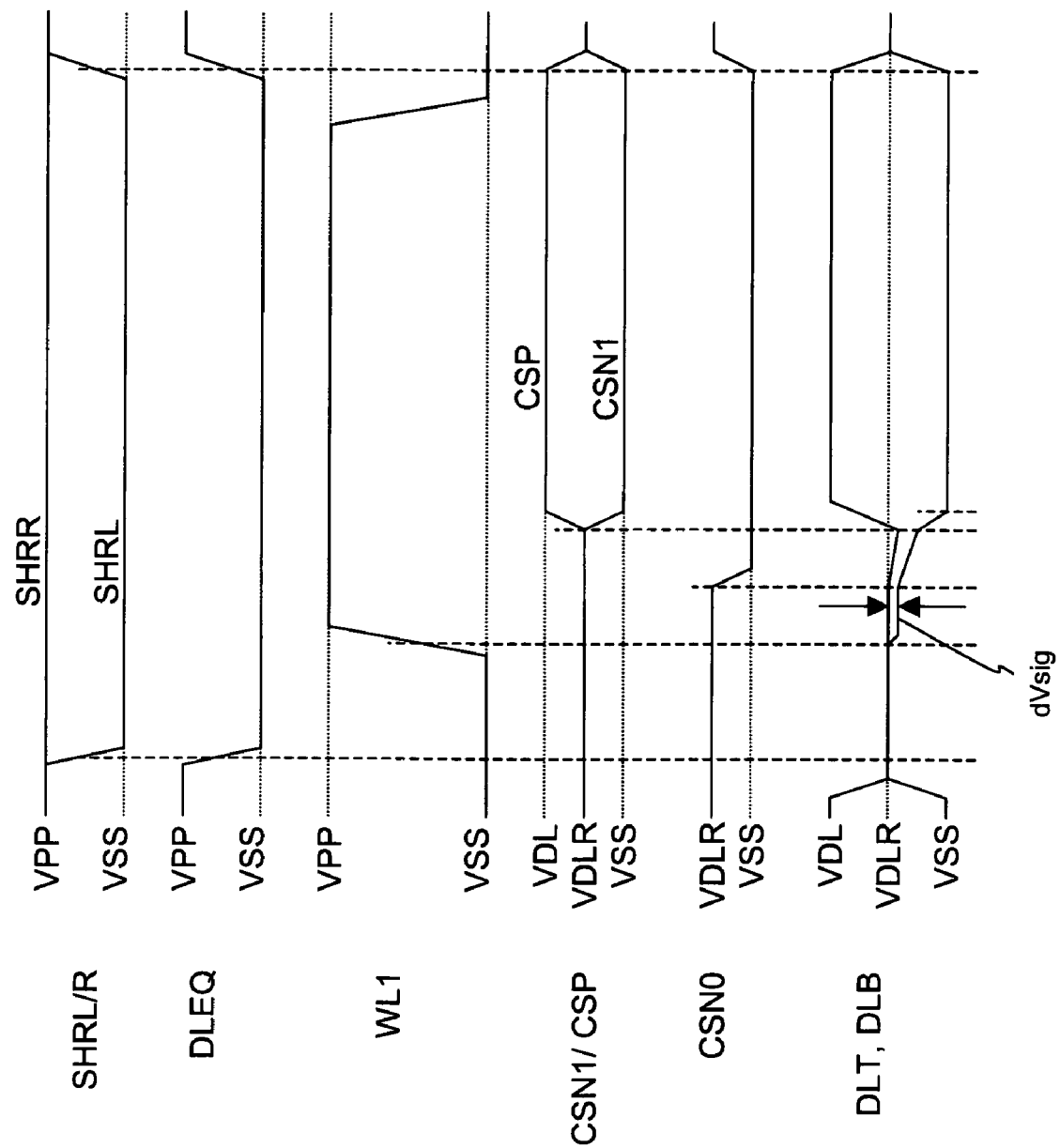
FIG. 10 is a diagram showing an example of the operation waveform of the sense amplifier when the layout of the sense amplifier in FIG. 9 is used.
Figure 11:
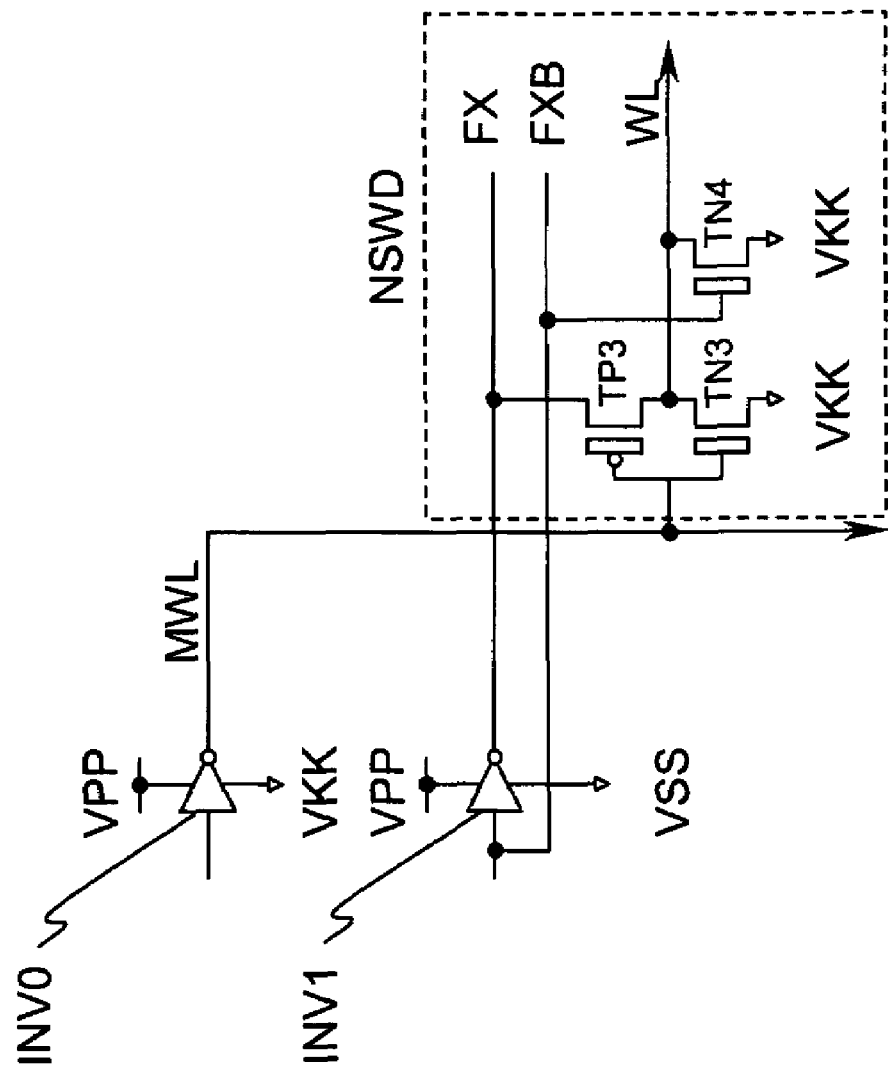
FIG. 11 is a diagram showing the circuit configuration of a negative sub-word driver.
Figure 12:
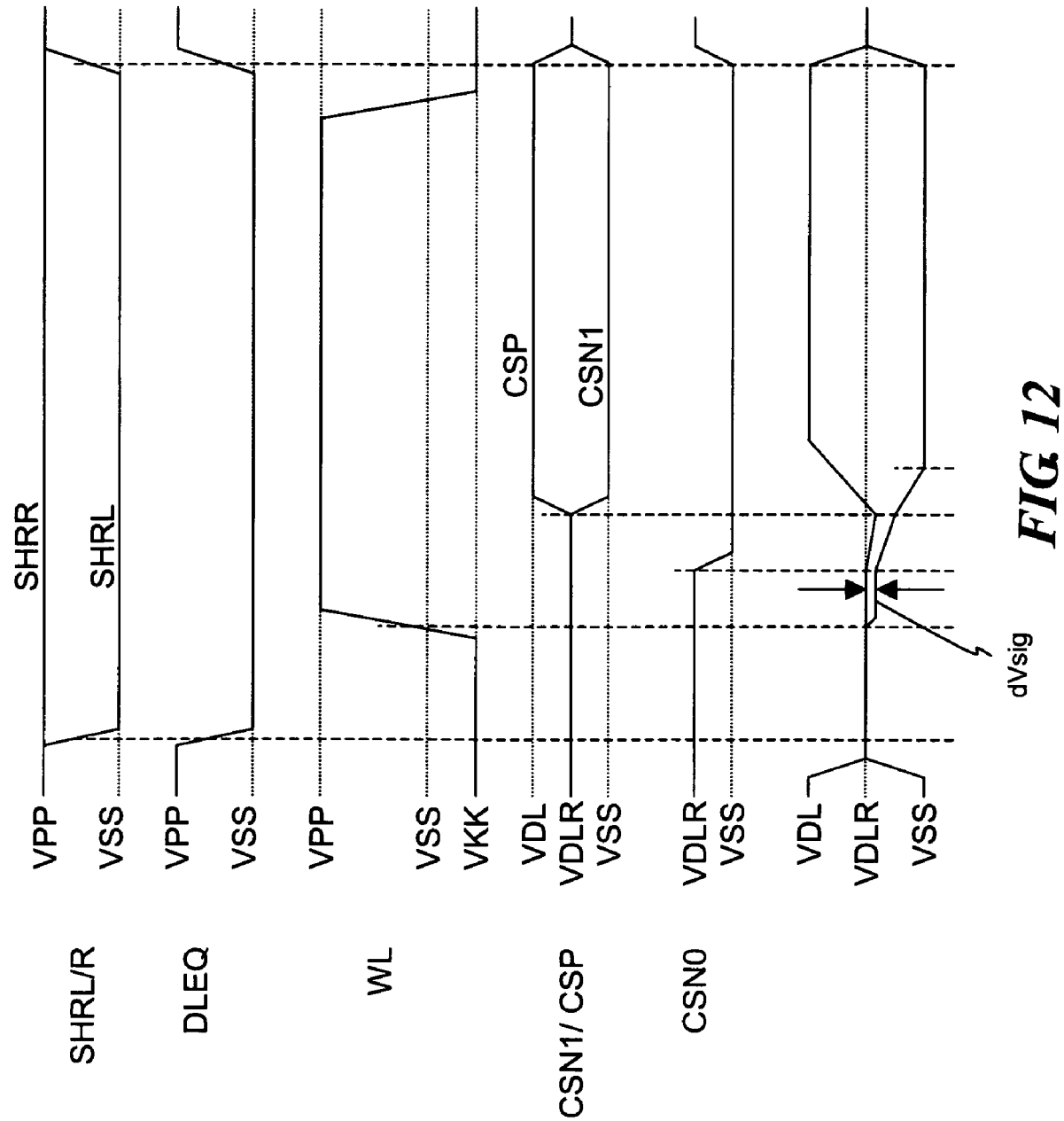
FIG. 12 is a diagram showing an example of the operation waveform in the second embodiment in which the negative sub-word driver in FIG. 11 is applied to the sense amplifier of the present invention.
Figure 13:
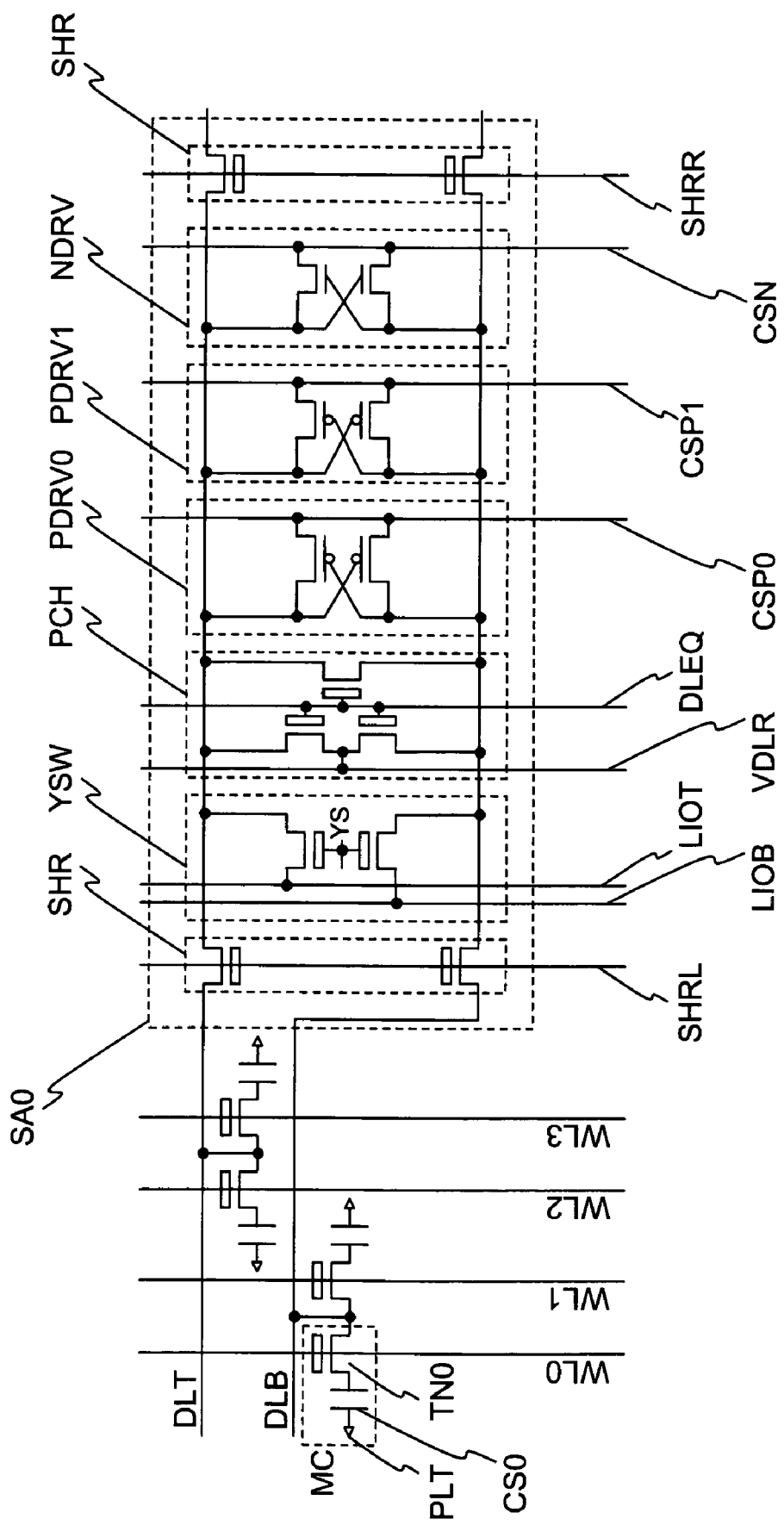
FIG. 13 is a diagram showing the basic configuration of the sense amplifier circuit part of the semiconductor memory device according to the third embodiment of the preset invention.
Figure 14:
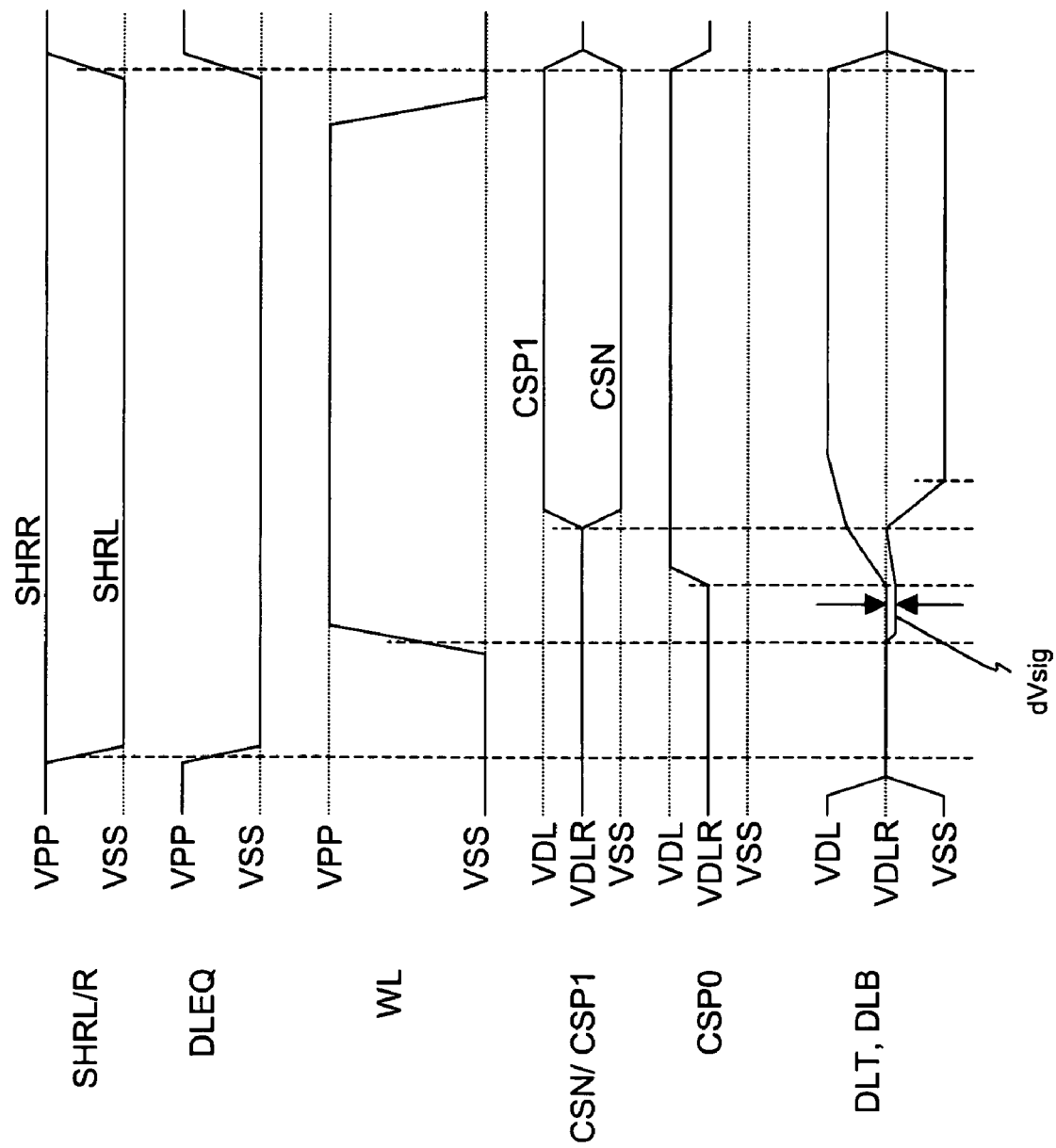
FIG. 14 is a diagram showing an example of the operation waveform of the sense amplifier shown in FIG. 13.
Figure 15:
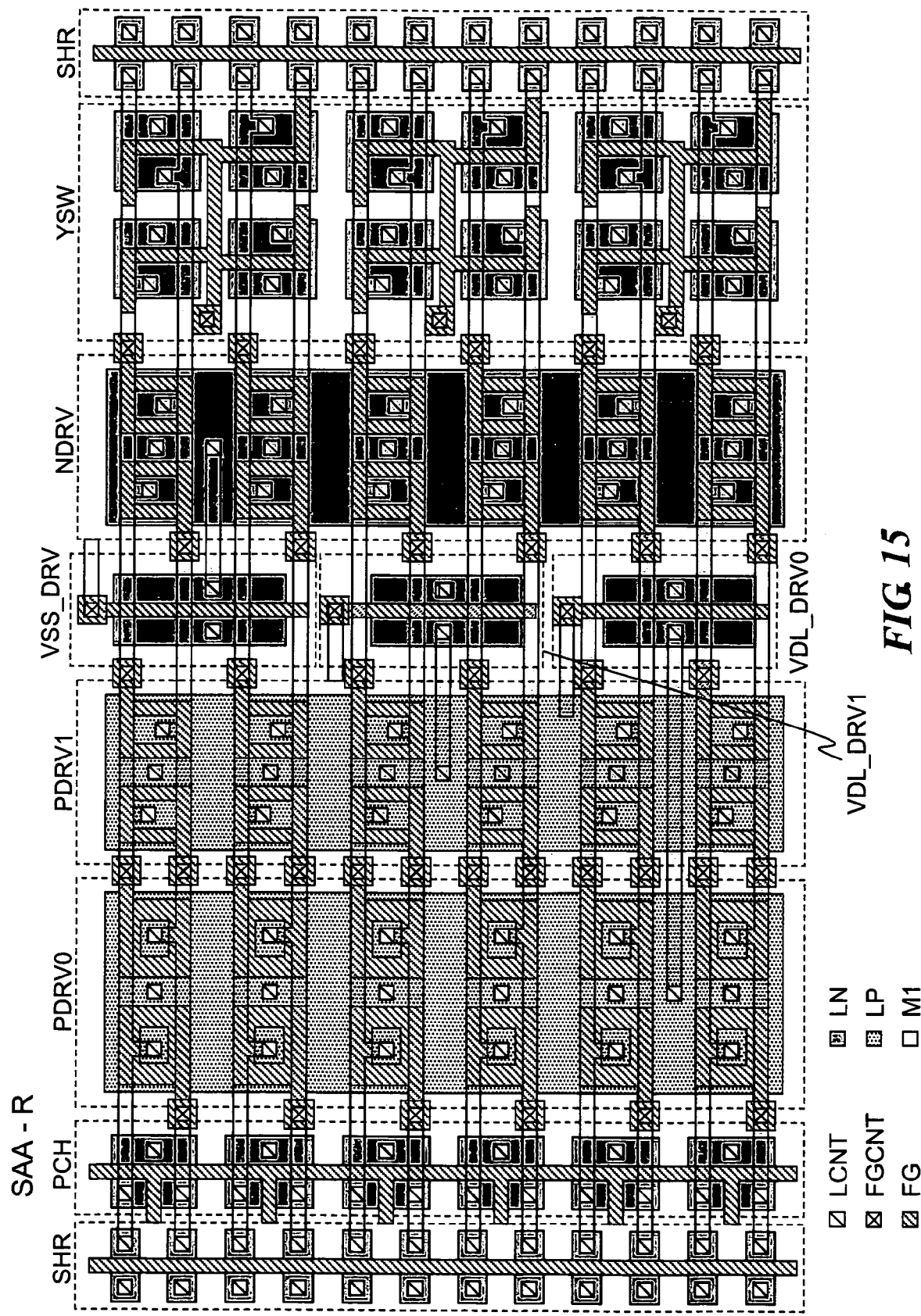
FIG. 15 is a plan view showing an example of the layout of the sense amplifier array comprised of a plurality of sense amplifiers shown in FIG. 13.
Figure 16:
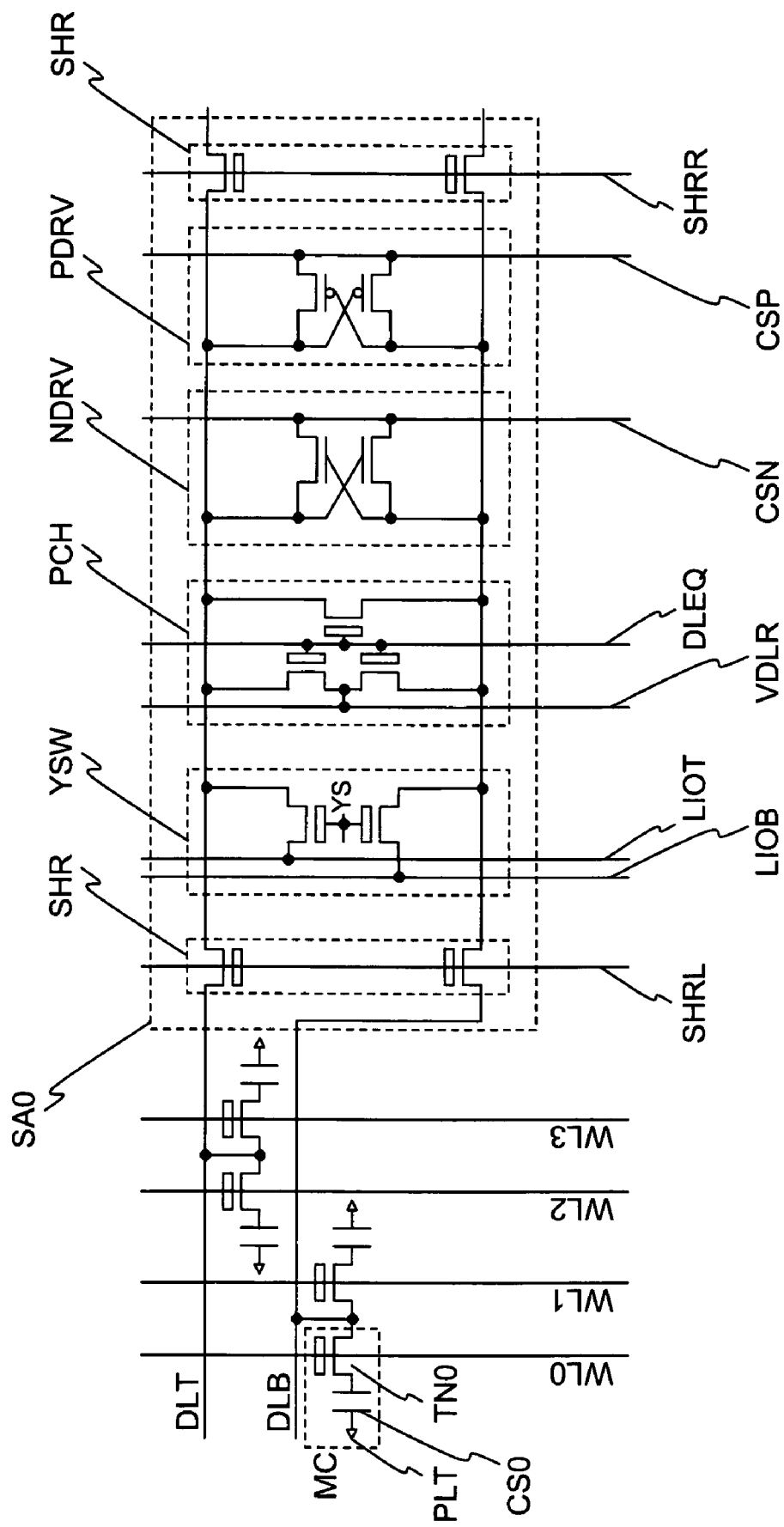
FIG. 16 is a diagram showing the basic configuration of the sense amplifier circuit part of the semiconductor memory device according to the fourth embodiment of the preset invention.
Figure 17:
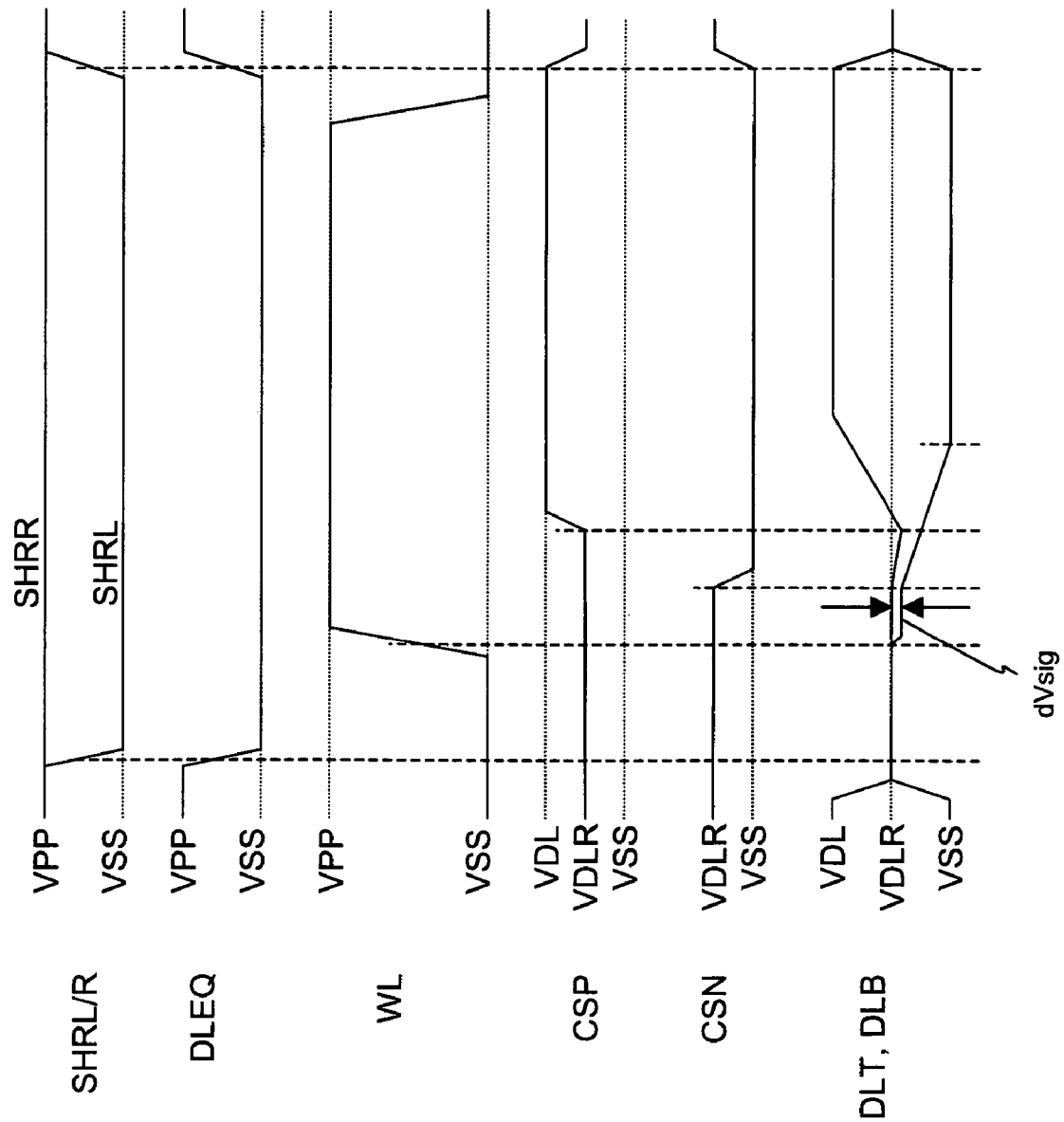
FIG. 17 is a diagram showing an example of the operation waveform of the sense amplifier shown in FIG. 16.
Figure 18:
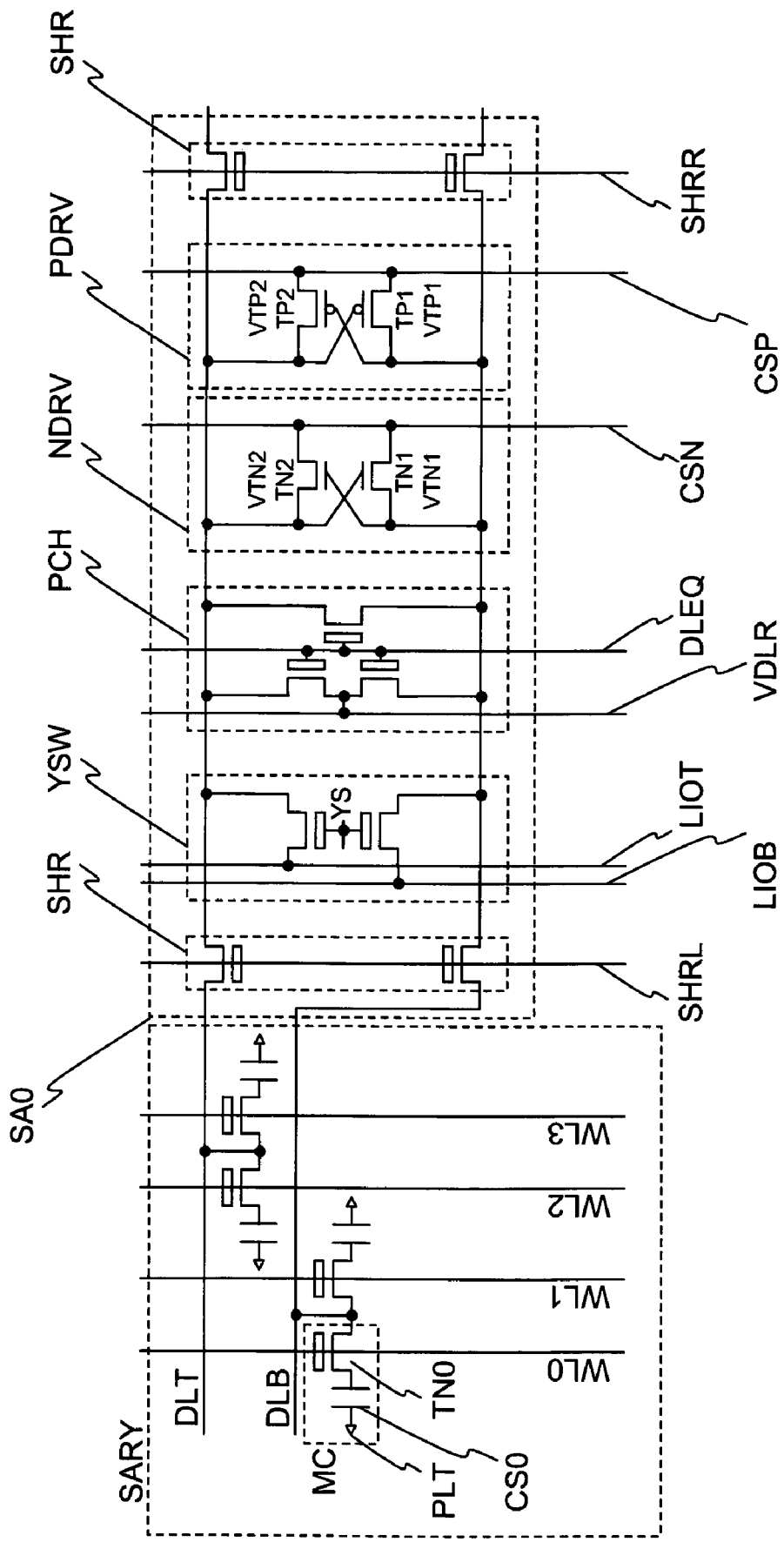
FIG. 18 is a diagram showing an example of the conventional sense amplifier circuit.
Figure 19:
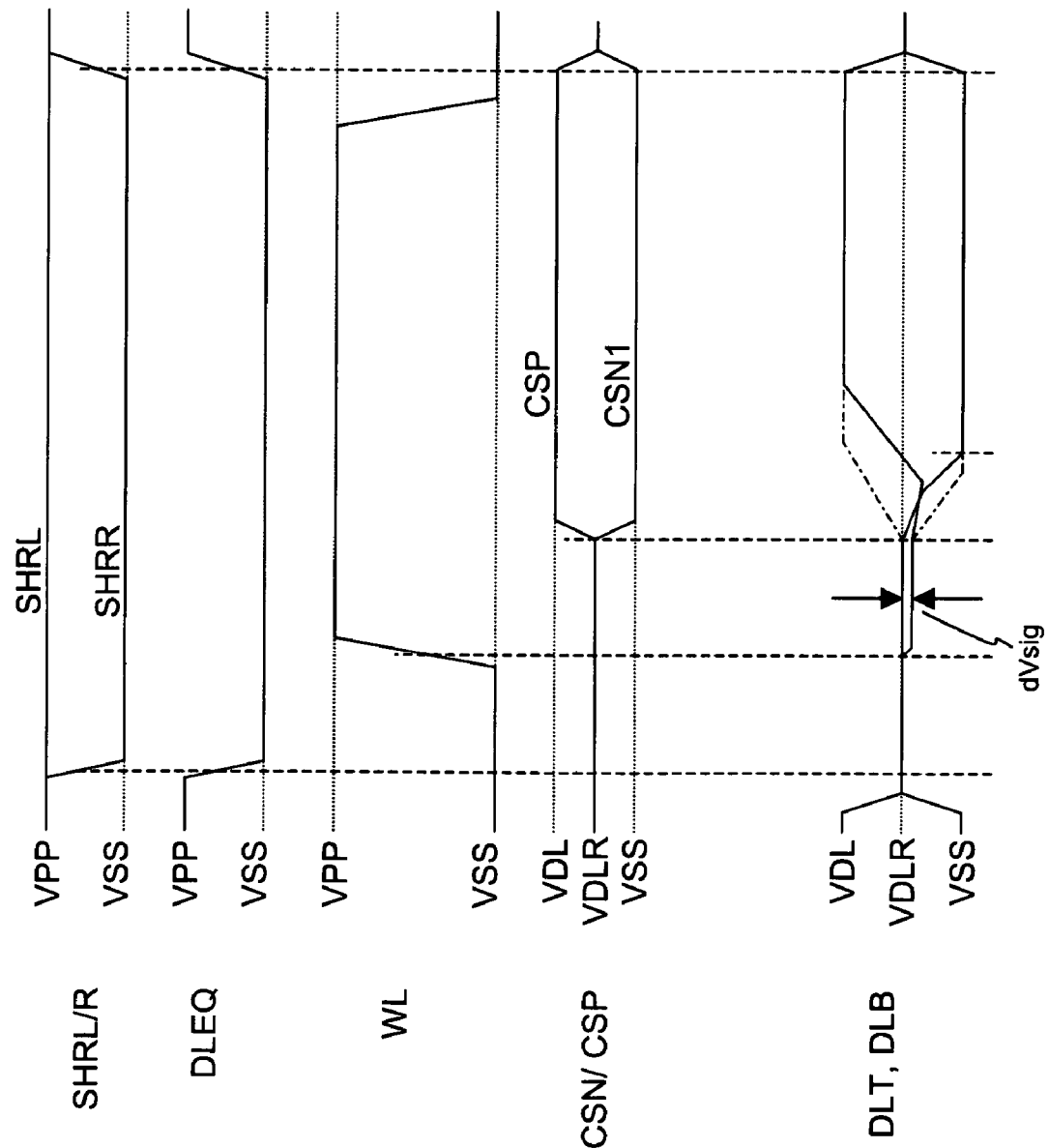
FIG. 19 is a diagram showing an example of the operation waveform of the conventional sense amplifier circuit.

FIG. 9 is a diagram showing a modified example of the layout of the sense amplifier circuit SA0 shown in FIG. 1. FIG. 10 is a diagram showing a timing waveform of the sense amplifier circuit SA0 in FIG. 9. FIG. 11 shows a concrete example of a sub-word driver circuit for applying a negative load to the word line. FIG. 12 is a diagram showing an operation waveform in the second embodiment in which a negative sub-word driver is applied to the sense amplifier. FIG. 13 shows the third embodiment of the preset invention in which the sense amplifier is comprised of a plurality of pull-up circuits. FIG. 14 is a diagram showing an operation waveform of the sense amplifier circuit in FIG. 13. FIG. 15 is a plan view showing the layout of the sense amplifier array comprised of a plurality of sense amplifier circuits in FIG. 13. FIG. 16 shows the fourth embodiment of the preset invention in which the sense amplifier is comprised of one pull-up circuit and one pull-down circuit. FIG. 17 is a diagram showing an operation waveform of the sense amplifier circuit in FIG. 16. FIG. 18 is a diagram showing a conventional sense amplifier circuit. FIG. 19 is a diagram for describing the operation waveform of the conventional sense amplifier circuit and the malfunction of the circuit.

(First Embodiment)

The first embodiment of the present invention will be described below with reference to FIGS. 1 to 10.

FIG. 1 shows the sense amplifier circuit SA0 comprised of a plurality of pull-down circuits NDRV0 and NDRV1, one pull-up circuit PDRV, a switch transistor SHR, a column switch YSW, and a precharge circuit PCH and a sub-array SARY0 comprised of a plurality of memory cells MC. Also, each of the reference symbols indicates common source lines CSN0 and CSN1 for driving the pull-down circuits NDRV0 and NDRV1, a common source line CSP for driving the pull-up circuit PDRV, a switch transistor drive lines SHRR and SHRL, a column switch drive line YS, a local data lines LIOT and LIOB, a precharge drive line DLEQ, precharge voltage VDLR, sub-word lines WL0 to WL3, data lines DLT and DLB, an access transistor TN0, a cell capacitor CS0, and a plate electrode PLT.

The plurality of memory cells MC are DRAM memory cells each provided with the N type channel MOS transistor TN0 and the capacitor CS0. The pull-up circuit PDRV is comprised of a pair of P type channel MOS transistors, in which a gate of one MOS transistor is connected to a drain of the other MOS transistor. Also, the pull-down circuits NDRV0 and NDRV1 are comprised of a pair of N type channel MOS transistors, in which a gate of one MOS transistor is connected to a drain of the other MOS transistor.

As shown in FIG. 1, the transistor constituting the pull-down circuit NDRV0 of the plurality of pull-down circuits in this embodiment has a channel length and a channel width larger than those of the transistor constituting the pull-down circuit NDRV1. That is, the transistor constituting the pull-down circuit NDRV0 has a larger driving force (constant). The reason why the constant of the transistor is increased is that, by increasing the constant, the drive current of the pull-down circuit NDRV0 can be increased and the offset can be reduced. In this case, it is desirable that the NMOS transistor constituting the other pull-down circuit NDRV1 has a small channel length or has a large channel width. The reason is as follows. That is, since the transistor constituting the pull-down circuit NDRV0 has a large channel length, the drive current of the pull-down circuit NDRV0 is sometimes reduced. Therefore, by reducing the channel length or increasing the channel width of the transistor constituting the pull-down circuit NDRV1 to make the drive current large, the data line can be amplified more rapidly. As described above, by adding only the pull-down circuit NDRV0 having the sufficiently reduced offset and preamplifying the data line pair to the voltage difference larger than the offset of the pull-down circuit NDRV1 and the pull-up circuit PDRV on the latter stage by driving the common source line CSN0, the reading malfunction can be prevented. Note that the detail of this operation will be described later.

FIG. 2 shows a concrete example of the bank BANK comprised of sense amplifier arrays SAA-R and SAA-L using a plurality of sense amplifier circuits SA0 according to this embodiment, a sub-array SARY0, and sub-word drives SWDA-U and SWDA-D. In the example of FIG. 2, common source control lines ΦCSN0, ΦCSN1, and ΦCSP are provided for the plurality of sense amplifier circuits SA0 to SA5. The circuits VSS_DRV0, VSS_DRV1, and VDL_DRV for driving the common source lines controlled by the common source control lines ΦCSN0, ΦCSN1, and ΦCSP are provided for each sub-array SARY0, and the sense amplifier arrays SAA-R and SAA-L employ the so-called distributed drive method. The sub-word drivers SWDA-U and SWDA-D are provided for each sub-array SARY0 and drive the sub-word lines WL0, WL1, WL2, WL3, WL4, and WL5 in the sub-array SARY0 in response to the selection of the address. VSS-U and VSS-D denote the ground voltage.

When compared with the configuration in FIG. 18, the increase of the area of the sense amplifier circuit SA0 in FIG. 1 is quite small because the added transistors are only a pair of NMOS transistors. Therefore, as shown in FIG. 2, the layout with a narrow data line pitch can be realized and the increase of the chip size can be reduced. Also, the sense amplifier circuit SA0 has the same configuration as that of the conventional sense amplifier circuit other than the addition of the pull-down circuit NDRV0. Therefore, when using the sense amplifier circuit SA0 of this embodiment, the change in the layout and the wiring configuration can be reduced to the minimum. Also, although the data line folding type array configuration in which the data line pair crosses the sub-word lines is shown in FIG. 2, the present invention is not limited to this. For example, the so-called data line open type array configuration is available, and the various modifications can be made within the scope of the present invention.

FIG. 3 shows an operation waveform for describing the operation of the sense amplifier circuit SA0 of this embodiment shown in FIG. 1. First, the precharge drive line DLEQ is asserted to precharge the data line pair to the precharge potential VDLR. There are many methods for driving the precharge drive line DLEQ. For example, the method using the row address signal and the sub-array selection signal is available. Similarly, the switch transistor SHRR is negated by using the row address. By doing so, the data line pair of the selection sub-array SARY0 is electrically connected to the sense amplifier array SAA-R. Next, when the sub-word line WL1 is asserted, the retained signal is outputted from the plurality of selection memory cells to the data line. For example, the minute signal corresponding to L of the memory cell MC in FIG. 2 is outputted to the data line DLT0. Thereafter, when the common source line CSN0 is driven to the ground voltage VSS, the data line DLT0 is driven to the VSS side more strongly than the data line DLB0.

Since the channel length and the channel width of the transistor of the pull-down circuit NDRV0 are increased and the offset is sufficiently reduced, the data line DLT0 can be driven to the VSS of L level more selectively. After amplifying the data line DLT0 to the voltage difference larger than the offset of the pull-down circuit NDRV1 and the pull-up circuit PDRV by using the pull-down circuit NDRV0, the common source lines CSN1 and CSP are driven to amplify the data line pair DLT0 and DLB0 to the low level VSS and to the high level VDL, respectively. The paired common source lines CSN1 and CSP are driven based on the same control signal, and as a result, they are changed from the precharge potential VDRL to the potentials VSS and VDL at almost the same timing. After the rewriting to the memory cell MC, the sub-word line WL0 is negated. Thereafter, the common source lines CSN0, CSN1, and CSP are precharged to the precharge voltage VDLR, the precharge drive line DLEQ is asserted, and the data line pair is precharged to the desired precharge potential VDLR. This is the operation of the sense amplifier SA0 according to this embodiment of the present invention.

As described above, by adding the pull-down circuit NDRV0 in which the offset is sufficiently reduced, the reading malfunction can be prevented. Also, the so-called sense amplifier offset margin in the design of the signal amount of DRAM can be reduced. Therefore, even when the signal amount is reduced due to the reduction of the data line voltage VDL, since the above-described sense amplifier offset margin is almost unnecessary, the stable read operation can be realized. More specifically, the low-voltage operation can be realized and the low power consumption can be achieved. Also, even if the data line length is increased, the stable read operation can be realized. The reason will be briefly described below. Usually, when the data line length is increased, the parasitic capacitance of the data line is increased. Therefore, the signal amount outputted to the data line is reduced. As a result, the voltage difference applied to the sense amplifier circuit is reduced and the operation of the sense amplifier becomes unstable. However, when the sense amplifier circuit SA0 according to this embodiment is used, even if the voltage difference applied to the sense amplifier circuit SA0 is small, the data line can be preamplified because the offset of the pull-down circuit NDRV0 is sufficiently small. More specifically, since it is possible to preamplify the data line to be larger than the offset of the pull-down circuit NDRV1 and the pull-up circuit PDRV by using the pull-down circuit NDRV0, the stable read operation can be realized even if the data line length is increased. In other words, the highly-integrated semiconductor memory device with a large memory occupancy can be realized.

FIGS. 4 and 5 are plan views showing the layout of the sense amplifier array SAA-R comprised of a plurality of sense amplifier circuits SA0 in FIG. 1. Some of the symbols indicating the parts enclosed by dotted lines correspond to each circuit constituting the sense amplifier circuit SA0 in FIG. 1. The symbols other than these, that is, YS0 to YS2 denote the column switch drive lines and LIO0T, LIO0B, LIO1T, and LIO1B denote the local data lines. Note that FIG. 5 shows an example of the wiring layout of the contact V2 and the second wiring layer M2. Also, the symbols in FIGS. 4 and 5 denote the gate contact FGCNT which connects the gate electrode and the first wiring layer M1 (data line), the diffusion layers LN and LP, the gate electrode FG, the diffusion layer contact LCNT which connects the diffusion layers LN and LP and the wiring layer M1, and the contact V2 which connects the second wiring layer M2 and the third wiring layer M3. Note that the contact V1 which connects the first wiring layer M1 and the second wiring layer M2 is not illustrated. Also in FIG. 4, the common source drives VSS_DRV0, VSS_DRV1, and VDL_DRV are used to drive the common source lines CSN0, CSN1, and CSP and are provided for a plurality of sense amplifier circuits SA0 to SA5. That is, an example of the layout employing the so-called distributed drive method is shown in FIG. 4.

More specifically, for one sub-array SARY0, a plurality of circuits VDL_DRV, VSS_DRV0, and VSS_DRV1 for driving the common source line are dispersedly arranged between a plurality of pull-down circuits NDRV0 and pull-down circuits NDRV1 operated as a pair and a plurality of pull-up circuits PDRV. The control lines ΦCSN0, ΦCSN1, and ΦCSP for controlling the drive circuits VDL_DRV, VSS_DRV0, VSS_DRV1 extend in the same direction and are formed of the same wiring layer as the power source line for supplying the precharge voltage VDLR, the local data lines LIOT, LIO0T, LIO1T, LIOB, LIO0B, and LIO1B, the common source lines CSN0, CSN1, and CSP, and the power source line for supplying the data line voltage VDL and the ground voltage VSS. These wirings are formed in the same direction as that of the word line. The column switch drive lines YS0 to YS2 are connected to the column switch YSW via the contact V2, formed in the third wiring layer M3 on the second wiring layer M2, and extend in the same direction as the data line.

As described above, since the drive circuits are dispersedly arranged in each of the sense amplifier arrays SAA-R corresponding to the sub-array SARY0, the common source line can be driven at high speed. Also, since the drive circuits are arranged between the pull-down circuit NDRV1 and the pull-up circuit PDRV, the efficient layout can be realized. Note that the description of some part of the wiring layer is omitted in order to prevent the drawing from being complicated.

As shown in FIGS. 4 and 5, the added circuit in the sense amplifier circuit SA0 in FIG. 1 is only the pull-down circuit NDRV0. Therefore, as is apparent from FIG. 4, the increase of the area of the sense amplifier circuit SA0 is small. Also, since the symmetric property of the layout is excellent, the data line noise is small. Further, since the layout similar to the conventional pull-down circuit NDRV1 is possible and the additional wiring required when adding the circuit is only the common source line CSN0, the circuit can be easily realized. The transistors of the pull-down circuits NDRV0 and NDRV1 and the pull-up circuit PDRV have the ring-shaped gates. By the ring-shaped gate electrodes, the offset of the sense amplifier circuit can be further reduced.

Note that the shape of the gate electrode FG of the pull-down circuit NDRV0 is illustrated as a ring shape in FIG. 4. However, the present invention is not limited to this. The gate electrode FG with a U shape and a rectangular shape is also available. Also, it is also preferable to operate the sense amplifier circuit SA0 while reducing the drive speed of the common source line CSN0 shown in FIG. 3 by making the channel width of the common source driver VSS_DRV0 narrower than that shown in FIG. 4 or driving the common source control line ΦCSN0 slowly. By doing so, even when the offset of the pull-down circuit NDRV0 is increased, the data line DLT0 can be preamplified accurately. Also, though not shown in the drawing, it is also preferable to use the so-called overdrive method in combination, in which the common source line CSP is boosted to be higher than the high level VDL of the data line. Also in this case, the effect of the low-voltage operation and the high-speed operation can be achieved. As described above, it is needless to say that various modifications can be made within the scope of the present invention.

FIG. 6 is a plan view showing the layout of the memory cell MC and the sense amplifier arrays SAA-L and SAA-R connected thereto. The access transistor TN0 is comprised of the sub-word line WL and the diffusion layer ACT, and the cell capacitor CS0 is comprised of the storage node SN and the plate electrode PLT. Other symbols denote the cell contact CCNT for connecting the diffusion layer ACT to the wiring and the contact thereon, the data line contact DLCNT for connecting the data lines DLT and DLB to the cell contact CCNT, and the storage node contact SNCNT for connecting the landing pad LPAD to the cell contact CCNT. In this case, the landing pad LPAD is a contact for connecting the storage node SN and the storage node contact SNCNT and can optimize the location of the cell capacitor CS0. Therefore, the surface area of the cell capacitor CS0 can be increased. Of course, if the capacity of the cell capacitor CS0 can be sufficiently secured, the landing pad LPAD is not necessarily required. In such a case, since the number of process steps can be reduced, the required cost can be reduced.

Figure 6A:
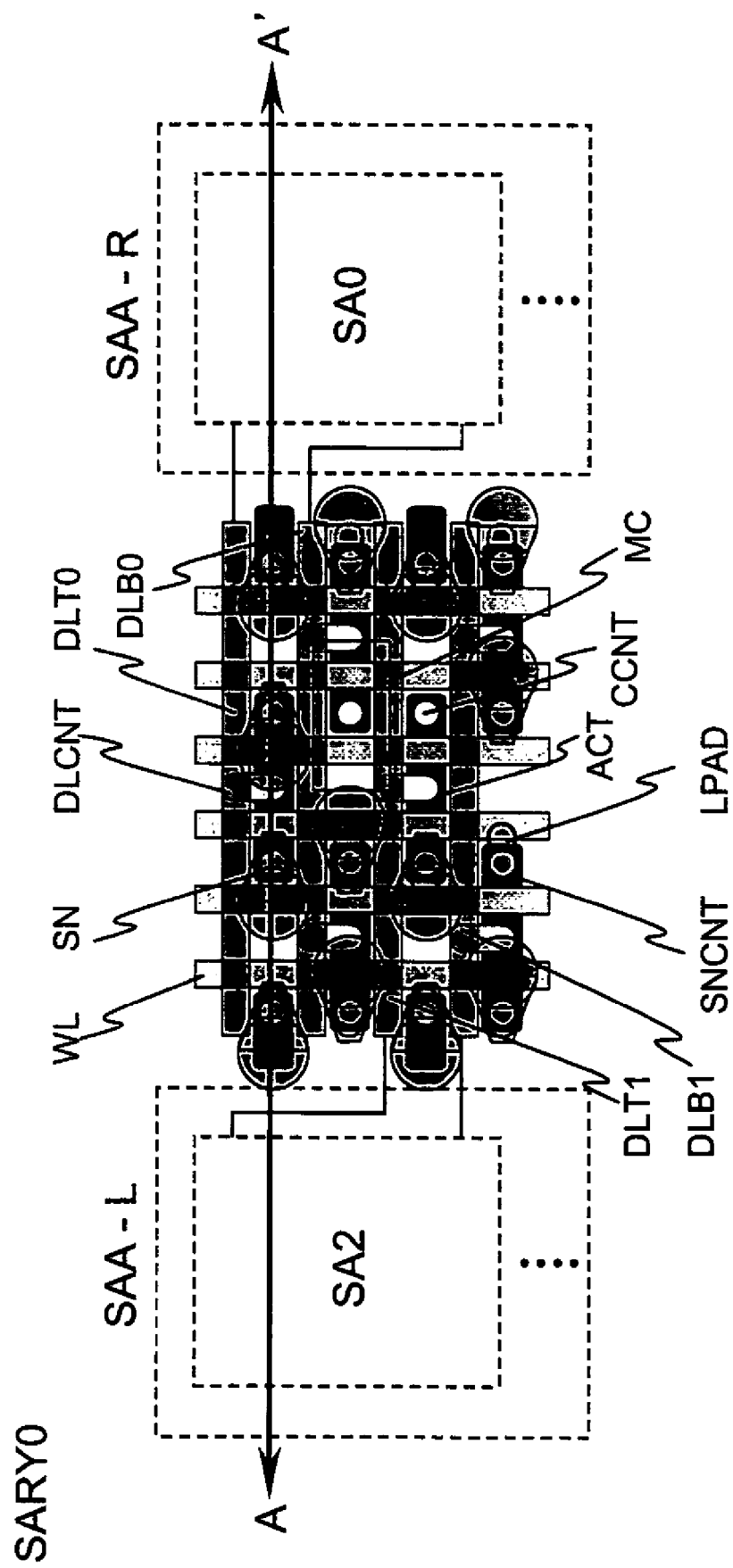
FIG. 6 is a plan view showing an example of the layout of the memory cells shown in FIG. 1.
Figure 6C:
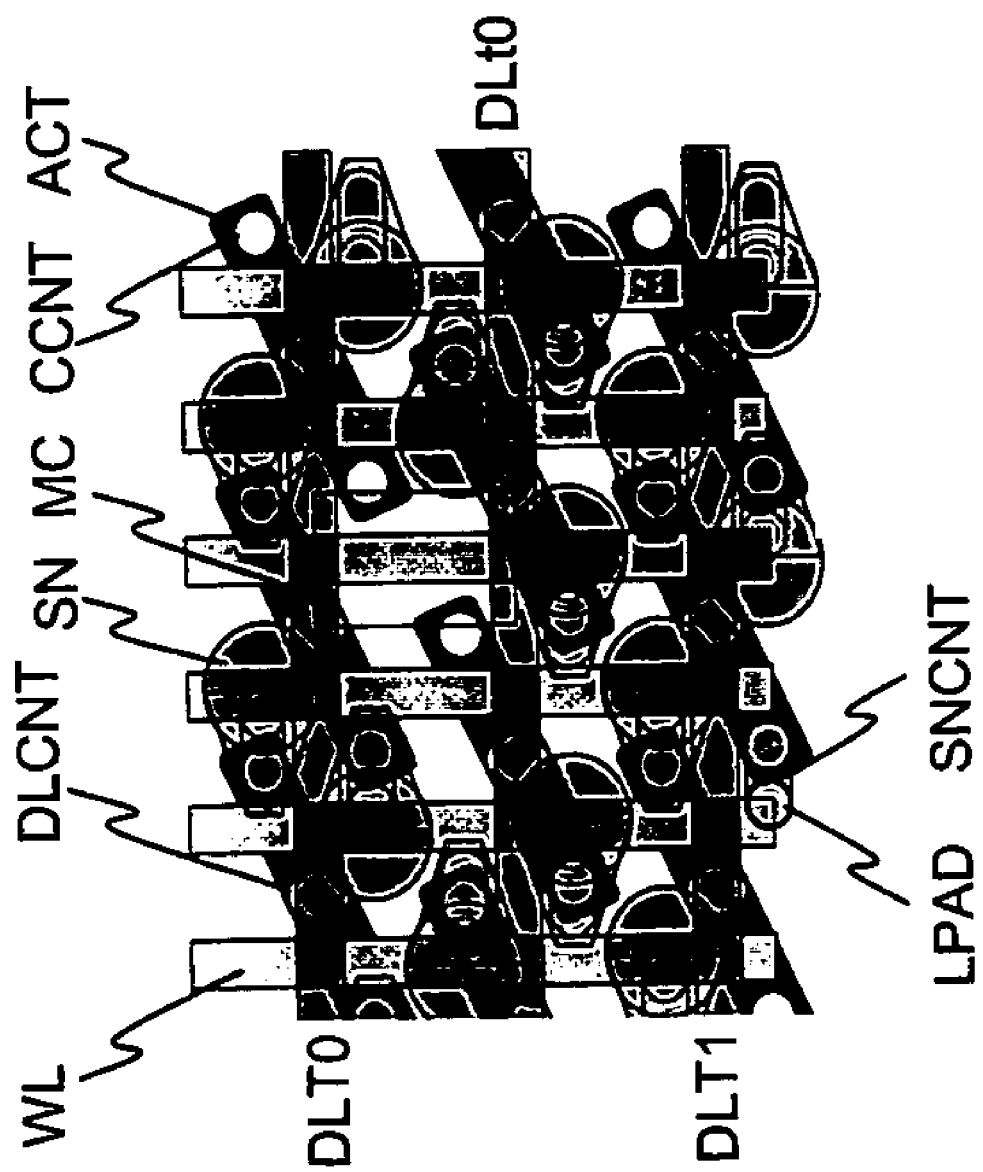
Figure 6D:
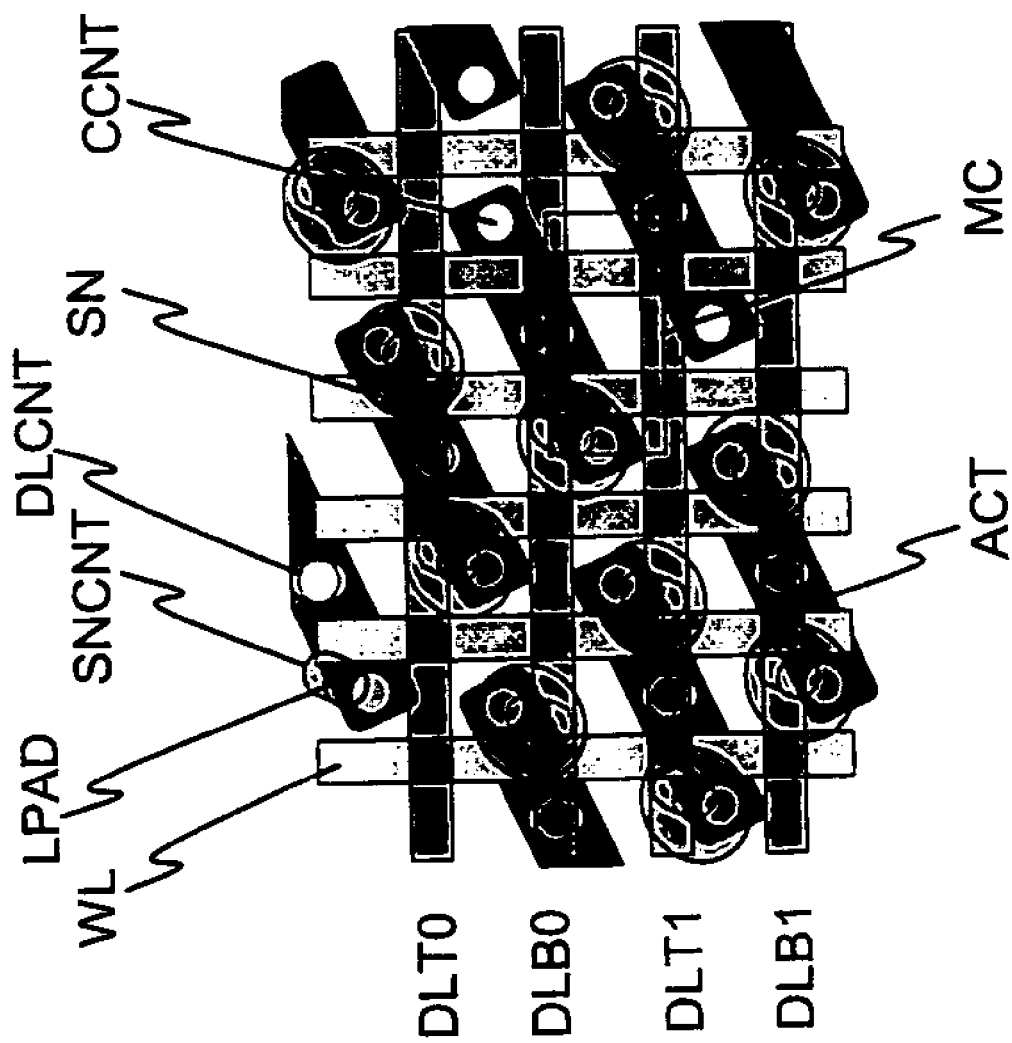

Also, various modifications of the layout of the memory cell MC can be made as shown in FIG. 6. For example, FIG. 6A shows the so-called folded data-line configuration, in which the scaling down is easy because the diffusion layer ACT has a simple rectangular shape. Also, FIG. 6B shows the pseudo folded data-line configuration. The difference from FIG. 6A is that the diffusion layer ACT is laid diagonally to the sub-word line WL. Therefore, since the effective channel width can be increased, the ON-current of the access transistor TN0 can be increased. When using it in combination with the sense amplifier circuit SA0 according to this embodiment, the semiconductor memory device capable of achieving further high-speed operation can be realized. FIGS. 6C and 6D show the open data-line configuration. When compared with the folded data-line configuration, the cell area can be reduced. Since the data line of FIG. 6C has a wide pitch, the parasitic capacitance of the data line can be reduced. Therefore, when using it in combination with the sense amplifier circuit SA0 according to this embodiment, the highly-integrated semiconductor memory device capable of achieving further low-voltage operation can be realized. Since the cell area in FIG. 6D is smaller than that in FIG. 6C, when using it in combination with the sense amplifier circuit SA0 according to this embodiment, the further highly-integrated semiconductor memory device can be realized.

The layout applicable to the sense amplifier of the present invention is not limited to them. For example, the layout in which the diffusion layer ACT laid diagonally to the sub-word line WL in the open data-line configuration of FIG. 6D is changed to be orthogonal to the sub-word line WL like in FIG. 6A is also available. In such a case, the scaling down can be easily performed because of the rectangular shape. Further, by applying the low level VSS to the sub-word line WLA while commonly using the diffusion layer ACT of the adjacent left and right cells of the sub-ward line SWLA, the device isolation is enabled. In this case, since it is unnecessary to form the device isolation region made of insulator extending in a direction parallel to the data line, the number of process steps can be reduced and the required cost can be reduced.

FIG. 7 is a cross-sectional view showing apart of the plurality of memory cells MC and the sense amplifier circuit SA0 shown in FIG. 6. In FIG. 7, the second wiring layer M2, the third wiring layer M3, the P well substrate PW, the N well substrate NW, the deep N well substrate DNWELL, and the P type substrate PSUB are provided. Note that the forming method of these components is the same as that of the standard semiconductor memory device, in particular, the so-called general purpose DRAM. Therefore, the detail description thereof is omitted here. Also, the configuration of the cell capacitor CS0 is not limited to this. For example, a crown-like shaped capacitor and other capacitor are available as the cell capacitor CS0.

As described above, since only the two NMOS transistors and the wiring for the common source line CSN0 are added in the sense amplifier circuit SA0 of this embodiment, the circuit can be easily realized. The diffusion layer of the NMOS transistor of the pull-down circuit NDRV0 can be formed in the same P type well PW as the diffusion layer of the transistor in the memory cell and the diffusion layer of the NMOS transistor of the pull-down circuit NDRV1. Also, since it is unnecessary to additionally arrange the wiring on the sub-array SARY0, the wiring noise does not occur. Therefore, it does not cause any problem for the memory operation.

FIG. 8 is a block diagram showing an example of the DRAM comprised of a plurality of banks BANK shown in FIG. 2. The symbols in FIG. 8 denote the address buffer ADDRESS BUFFER, the column address buffer COLUMN ADDRESS BUFFER, the column address counter COLUMN ADDRESS COUNTER, the row address buffer ROW ADDRESS BUFFER, the refresh counter REFRESH COUNTER, the bank select BANK SELECT, the mode resister MODE RESISTER, the row decoder ROW DEC, the column decoder COLUMN DEC, the main sense amplifier SENSE AMP, the memory cell array MEMORY CELL ARRAY, the data input buffer Din BUFFER, the data output buffer Dout BUFFER, the data buffer DQS BUFFER, the delay locked loop DLL, the control logic CONTROL LOGIC, the clocks CLK and /CLK, the clock enable signal CKE, the chip select signal /CS, the row address strobe signal /RAS, the column address strobe signal /CAS, the write enable signal /WE, the data write signal DW, the data strobe signal DQS, and the data DQ. Note that since the control method of these circuits and signals is the same as that of the well-known SDRAM, the detail description thereof is omitted here. By constituting the bank BANK shown in FIG. 8 by using the sense amplifier circuit SA0 of this embodiment, a semiconductor memory device such as the synchronous dynamic memory SDRAM can be realized. Of course, by using the sense amplifier circuit SA0 in this embodiment, the above-described effects of the low-voltage operation and the like can be realized. Also, the configuration of the blocks is not limited to that shown in FIG. 8. For example, the configuration in which the number of memory cell arrays MEMORY CELL ARRAY is increased is also available, and various modifications can be made within the scope of the present invention.

FIG. 9 is a plan view showing a modified example of the layout of the sense amplifier array SAA-R comprised of the plurality of sense amplifier circuits SA0 shown in FIG. 1. The difference from FIG. 4 is that the gate electrode of the pull-down circuit NDRV2 has a rectangular shape not a ring shape. When the ring-shaped gate electrode is used like in the case of FIGS. 4 and 5, the drive current of the pull-down circuit NDRV1 is sometimes reduced. In such a case, by using the rectangular-shaped gate electrode as shown in FIG. 9, the drive current can be increased and the more stable operation can be realized. Note that since the layout of the contact V1, the second wiring layer M2, and the contact V2 is almost the same as that of FIG. 5, the description thereof with reference to the drawing is omitted here.

FIG. 10 shows an operation waveform when the layout of the sense amplifier in FIG. 9 is applied. Since the operation is basically identical to that of FIG. 3, the detail description thereof is omitted. The difference from FIG. 3 is as follows. That is, when driving the pull-down circuit NDRV2 and the pull-up circuit PDRV, since the drive current of the pull-down circuit NDRV2 is larger than that of the ring-shaped pull-down circuit NDRV1 of FIG. 4, the preamplified data line pair can be amplified more rapidly. Consequently, the semiconductor memory device capable of achieving the high-speed operation can be realized. In addition, although the case where the pull-down circuit NDRV2 is formed by using the rectangular gate electrode FG has been shown in FIG. 9, the rectangular gate electrode FG can be of course applied to the pull-up circuit PDRV. Also in this case, since the drive current of the pull-up circuit PDRV can be increased, the high-speed operation similar to the case described above can be realized. These are the descriptions of the first embodiment.

(Second Embodiment)

The case where the ground voltage VSS is applied to the sub-word line WL of the memory cell MC at the time of non-selection has been described in the first embodiment. However, it is also possible to apply the negative voltage.

FIGS. 11 and 12 show the case where the negative word driver NSWD is applied to the sense amplifier circuit SA0 of this embodiment.

FIG. 11 shows a modified example of the sub-word driver SWD constituting the sub-word array SWDA-U and SWAD-D in FIG. 2. The symbols in FIG. 11 denote the word line voltage VPP, the negative word line voltage VKK, the main word line MWL, the sub-word line control signals FX and FXB, and the inverters INV0 and INV1. Since the control method of these signals is the same as that of the standard sub-word driver, the description thereof is omitted here.

FIG. 12 is a diagram showing the operation waveform in the case where the negative sub-word driver NSWD in FIG. 11 is applied to the sense amplifier circuit SA0 of this embodiment. The difference from the operation waveform in FIG. 3 is that the word line voltage at the time of non-selection is the negative voltage lower than the potential for driving the pull-down circuit. As described above, by applying the negative voltage at the time of non-selection of the word line, the threshold voltage of the access transistor can be effectively increased. In other words, even when the threshold voltage of the access transistor TN0 is set low, the problem of the degradation of the so-called retention characteristics of the DRAM does not occur. More specifically, since the impurity concentration of the channel region can be reduced, the junction electrical field between the diffusion layer ACT and the P well substrate PW can be reduced. As a result, since the leakage current through the diffusion layer ACT can be reduced, the semiconductor memory device capable of achieving the further low-power consumption can be realized. In addition, since the impurity concentration can be reduced, the variation in threshold voltage of the access transistor TN0 can be also reduced. As a result, it becomes unnecessary to set the word line voltage VPP higher than necessary in the write operation. More specifically, since it becomes possible to reduce the thickness of the gate insulating film of the access transistor TN0, the further scaling down can be performed and the further highly-integrated semiconductor memory device can be realized.

Also, it is needless to say that the more effects can be obtained by using the sense amplifier circuits of this embodiment in combination. More specifically, as described above, the sufficiently stable read operation can be realized in the sense amplifier circuit SA0 of this embodiment even when the read signal amount is reduced by the voltage reduction. Furthermore, when the sense amplifier circuit SA0 of this embodiment is used in combination with the layout to which the rectangular gate electrode is applied, the high-speed operation can be of course realized. Also, by using the negative sub-word driver NSWD, the scaling down of the access transistor TN0 can be realized. That is, since the further scaling down of the memory cell MC can be realized, it is possible to reduce the parasitic capacitance of the data line. As a result, the highly-integrated semiconductor memory device capable of achieving further low-voltage operation can be realized.

(Third Embodiment)

The case where a plurality of pull-down circuits are applied has been described in the first and second embodiments. In this case, the size of the offset of the pull-down circuit determines whether the stable read operation is enabled or the malfunction occurs. Therefore, since it is unnecessary to reduce the offset of the pull-up circuit more than necessary, the number of masks required to form the PMOS transistor can be reduced by using the so-called buried channel type PMOS transistor.

Of course, the present invention is not limited to the embodiments described above, and it is also preferable to form the sense amplifier circuit SA0 by using a plurality of pull-up circuits. In this case, it is preferable that the so-called dual gate transistor instead of the so-called buried channel type transistor is used as the PMOS transistor constituting the pull-up circuit. By doing so, though the number of masks required to form the PMOS transistor is increased, since the transistor configuration is simplified, the variation in threshold voltage of the PMOS transistor can be reduced.

FIG. 13 is a circuit diagram of the sense amplifier circuit SA0 using a plurality of pull-up circuits, FIG. 14 is a diagram showing the operation waveform thereof, and FIG. 15 is a plan view showing the layout thereof.

As shown in FIG. 13, the sense amplifier circuit SA0 of this embodiment is comprised of a plurality of pull-up circuits PDRV0 and PDRV1. Since other components are the same as those in the above-described embodiments, the description thereof is omitted. Also, similar to the above-described embodiments, the PMOS transistor constituting the pull-up circuit PDRV0 shown in FIG. 13 has a channel length and a channel width larger than those of the PMOS transistor constituting the pull-up circuit PDRV1. That is, the transistor constituting the pull-up circuit PDRV0 has a larger driving force (constant). The reason why the constant of the transistor is increased is that it is necessary to sufficiently reduce the offset of the pull-up circuit PDRV0 and sufficiently preamplify the data line pair to the voltage difference larger than the offset of the pull-up circuit PDRV1 and the pull-down circuit NDRV driven in the latter stage. By doing so, the reading malfunction can be prevented.

FIG. 14 is a diagram showing the operation waveform for describing the operation of the sense amplifier circuit SA0 in FIG. 13. Since the operation is basically identical to that of FIG. 3, the detail description thereof is omitted. The difference from FIG. 3 is as follows. That is, after the minute signal difference dVsig is outputted to the data line pair, the common source driver VDL_DRV is asserted to drive the common source line CSP0 to the data line voltage VDL, and the pull-up circuit PDRV0 is activated to preamplify the data pair. By doing so, the data line DLB0 is driven to the VDL side more strongly than the data line DLT0. Next, by driving the pull-up circuit PDRV1 and the pull-down circuit NDRV, the data line pair is amplified to the high level VDL and the low level VSS. This is the operation of the sense amplifier circuit SA0 in this third embodiment.

FIG. 15 is a plan view showing an example of the layout of the sense amplifier array SAA-R comprised of a plurality of sense amplifier circuits SA0 in the third embodiment. The difference from the layout in FIG. 4 is that a plurality of pull-up circuits PDRV0 and PDRV1 and the common source drivers VDL_DRV0 and VDL_DRV1 for driving them are provided. Note that since other components are the same as those in the above-described embodiments, the description thereof is omitted. Also, since the layout of the contact V1, the second wiring layer M2, and the contact V2 is the same as that of FIG. 4, the illustration thereof is omitted here. As shown in FIG. 15, also in the case where a plurality of pull-up circuits are used, the symmetric property of the layout is excellent and the data line noise is small. Also, since the number of added transistors is only two and only a little wiring is added, it can be realized easily.

In the foregoing, the third embodiment has been described with reference to FIGS. 13 to 15. However, it is needless to say that the present invention is not limited to this. For example, the pull-up circuit with a rectangular gate electrode as shown in FIG. 9 can be applied and the negative sub-word driver NSWD as shown in FIG. 2 can be used. In addition, though FIG. 15 shows an example of the layout employing the so-called distributed driver method similar to FIG. 4, the layout is not limited to this. It is also preferable to use the so-called overdrive method in which the common source line CSP0 is boosted to be higher than the high level VDL of the data line in combination. It is needless to say that the effect as described above can be obtained also in this case. The various modifications can be made within the scope of the present invention.

(Fourth Embodiment)

In the first to third embodiments, the sense amplifier circuit includes a plurality of pull-down circuits or a plurality of pull-up circuits. However, if the high-speed operation is not required, the sense amplifier circuit comprised of one pull-down circuit and one pull-up circuit is also available in some cases. In such a case, in order to reduce the offset, the channel length and the channel width of the transistor constituting the pull-down circuit and the pull-up circuit are increased. Furthermore, the data line pair is preamplified to be larger than the offset of the pull-up circuit by driving, for example, the pull-down circuit prior to the pull-up circuit.

FIG. 16 is a diagram showing the sense amplifier circuit SA0 in this embodiment. The difference from the above-described embodiments is that the sense amplifier circuit is comprised of one pull-down circuit and one pull-up circuit. Also, since other components in FIG. 16 are the same as those of the above-described embodiments, the description thereof is omitted here. As described above, since it is not necessary to add any circuit to the conventional sense amplifier circuit in this embodiment, the area of the sense amplifier circuit SA0 can be reduced in comparison to the above-described embodiments. Also, since it is not necessary to add any driving signal, the addition of the wiring is not required and the process cost can be reduced. More specifically, the semiconductor memory device capable of achieving both the stable reading operation and the area reduction of the sense amplifier can be realized.

FIG. 17 is a diagram showing the operation waveform of the embodiment shown in FIG. 16. Since the operation is basically identical to that of FIG. 3, the detail description thereof is omitted. The difference from FIG. 3 is as follows. That is, after the minute signal difference dVsig is outputted to the data line pair, the common source driver VSS_DRV is asserted to drive the common source line CSN to VSS, and the pull-down circuit NDRV is first activated. After the data line DLT0 is sufficiently amplified to be larger than the offset of the pull-up circuit PDRV, the common source driver VDL_DRV is asserted to drive the common source line CSP to the high level VDL, and the pull-up circuit PDRV is activated. Since the data line DLT0 is sufficiently amplified by the pull-down circuit NDRV activated in advance, the pull-up circuit PDRV can amplify the data line DLB0 to the high level VDL without malfunction. This is the operation of the sense amplifier SA0 in this fourth embodiment.

The pull-down circuit NDRV is first activated in this embodiment. However, it is needless to say that the same effect can be obtained even when the pull-up circuit PDRV is first driven. Also, when using it in combination with the above-described embodiments, the low-voltage operation and the higher integration can be achieved. As described above, various modifications can be made also in this embodiment within the scope of the present invention.

Also, in the description of the first to fourth embodiments, the one transistor DRAM cell is used as an example of the memory cell MC. However, the two transistor DRAM cell, that is, the so-called twin cell is also available. Also, the so-called OR cell which obtains the logical sum of two memory cells is also available when two memory cells are used. Of course, instead of the DRAM cell, the six-transistor static random access memory is also available, and various types of memory cells can be used in combination with the sense amplifier circuit of the present invention.

Furthermore, as an example of the method for reducing the offset, the channel length and the channel width of the transistor are increased. However, the present invention is not limited to this. For example, the method in which the impurity concentration of the transistor substrate constituting the sense amplifier is set low so as to reduce the variation in threshold voltage due to the impurity fluctuation is also available. Also, it is preferable to constitute the sense amplifier while reducing the threshold voltage of the NMOS transistor and the PMOS transistor which constitute the sense amplifier circuit. In this case, since the voltage applied to the sense amplifier circuit is effectively increased, the further high-speed operation can be realized. In addition, since the impurity concentration is reduced when the threshold voltage is reduced, the variation in threshold voltage can be reduced. Therefore, since the offset can be reduced, it is unnecessary to increase the driving force (constant) of the transistor, that is, the channel length and the channel width of the pull-down circuit and the pull-up circuit more than necessary. More specifically, it is possible to reduce the area of the sense amplifier circuit. Alternatively, it is also preferable to dynamically change the substrate voltage of the transistor constituting the above-described sense amplifier circuit at the time of the read operation. Also in this case, since the voltage difference applied to the sense amplifier circuit is effectively increased, the further high-speed operation can be realized.

For dynamically changing the substrate voltage of the transistor, the additional circuit is required. However, since it can be realized by a usual circuit modification, the illustration thereof is omitted here. Also in this case, it is necessary to apply different substrate voltages to the memory cell part and the sense amplifier part. However, since it can be realized by a simple circuit modification, the illustration thereof is omitted here. As described above, various modifications can be made in the sense amplifier circuit of the present invention in accordance with its purposes such as the low-voltage operation, the high-speed operation, and the higher integration.

What is claimed is:

1. A semiconductor device, comprising:
a memory array having a plurality of word lines, a plurality of data lines, and a plurality of memory cells arranged at intersections of said plurality of word lines and said plurality of data lines; and
a plurality of sense amplifier circuits connected to said plurality of data lines,
wherein each of said plurality of sense amplifier circuits is provided with a first MISFET pair of a first conductivity type in which a gate of one MISFET is connected to a drain of the other MISFET, a second MISFET pair of the first conductivity type in which a gate of one MISFET is connected to a drain of the other MISFET, and a third MISFET pair of a second conductivity type in which a gate of one MISFET is connected to a drain of the other MISFET, and
said first MISFET pair is a device having a drivability larger than that of said second MISFET pair.

2. The semiconductor device according to claim 1,
wherein said first conductivity type is an N type,
wherein sources of said first MISFET pair are connected to a first source line,
wherein sources of said second MISFET pair are connected to a second source line,
wherein sources of said third MISFET pair are connected to a third source line, and
wherein said first source line is driven before said second source line.

3. The semiconductor device according to claim 2,
wherein said second source line and said third source line are changed in response to the same signal from a first voltage to a second voltage and from said first voltage to a third voltage, respectively.

4. The semiconductor device according to claim 2, further comprising:
a first circuit for driving said second source line from a first voltage to a second voltage; and
a second circuit for driving said third source line from said first voltage to a third voltage,
wherein said second MISFET pair is arranged between said first MISFET pair and said third MISFET pair, and
wherein said first circuit and said second circuit are arranged between said second MISFET pair and said third MISFET pair.

5. The semiconductor device according to claim 4, further comprising:
a third circuit for driving said first source line from said first voltage to said second voltage, said third circuit being arranged between said second MISFET pair and said third MISFET pair, and
wherein a drivability of a MISFET in said first circuit is smaller than that of a MISFET in said third circuit.

6. The semiconductor device according to claim 2,
wherein said first MISFET pair is comprised of transistors with ring-shaped gates, and said second MISFET pair is comprised of transistors with rectangular gates.

7. The semiconductor device according to claim 2,
wherein said plurality of sense amplifier circuits are arranged along two opposed sides of the memory array, and
wherein sources of the first MISFET pairs of the sense amplifier circuits arranged on one of the sides are commonly connected to said first source line.

8. The semiconductor device according to claim 3,
wherein a voltage lower than said second voltage is applied to nonselected word lines of said plurality of word lines.

9. A semiconductor device, comprising:
a memory array having a plurality of word lines, a plurality of data lines, and a plurality of memory cells arranged at intersections of said plurality of word lines and said plurality of data lines; and
a plurality of sense amplifier circuits connected to said plurality of data lines,
wherein each sense amplifier circuit includes a first pull-up circuit, a first pull-down circuit, and a second pull-down circuit,
wherein, in a read operation, driving of said first pull-down circuit is started prior to driving of said first pull-up circuit, and
wherein said second pull-down circuit is comprised of transistors with a drivability smaller than that of transistors of said first pull-down circuit.

10. The semiconductor device according to claim 9,
wherein said first pull-down circuit is provided with first and second N type channel MISFETs with ring-shaped gates, and inputs and outputs of said first and second MISFETs are cross-coupled to each other,
wherein said second pull-down circuit is provided with third and fourth N type channel MISFETs with gates which are not ring-shaped, and inputs and outputs of said third and fourth MISFETs are cross-coupled to each other, and
wherein said first pull-up circuit is provided with fifth and sixth P type channel MISFETs with gates which are not ring-shaped, and inputs and outputs of said fifth and sixth MISFETs are cross-coupled to each other.

11. The semiconductor device according to claim 10,
wherein said second pull-down circuit is arranged between said first pull-down circuit and said first pull-up circuit.

12. The semiconductor device according to claim 11, further comprising:
a plurality of first circuits are provided for driving the first pull-down circuits of said plurality of sense amplifier circuits,
a plurality of second circuits are provided for driving the second pull-down circuits of said plurality of sense amplifier circuits, and
a plurality of third circuits are provided for driving the first pull-up circuits of said plurality of sense amplifier circuits, and
wherein said first to third circuits are dispersedly arranged between the second pull-down circuits and the first pull-up circuits.

13. The semiconductor device according to claim 10,
wherein each of said plurality of memory cells includes a capacitor, and a MISFET having a diffusion layer formed in the same well as diffusion layers of said first to fourth MISFETs of a corresponding sense amplifier circuit.

14. The semiconductor device according to claim 13, further comprising:
a fourth circuit provided for driving said plurality of word lines,
wherein said first and second pull-down circuits are driven when changed from a first voltage to a second voltage, and
wherein said fourth circuit applies a voltage lower than said second voltage to a nonselected word line of said plurality of word lines.

15. The semiconductor device according to claim 9,
wherein driving of said first pull-down circuit is started prior to driving of said second pull-down circuit and driving of said first pull-up circuit, in the read operation.

* * * * *